United States Patent
Ueda et al.

(10) Patent No.: US 10,074,796 B2
(45) Date of Patent: Sep. 11, 2018

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Miki Ueda, Tokyo (JP); Kaoru Miura, Matsudo (JP); Takayuki Watanabe, Yokohama (JP); Shunsuke Murakami, Sheffield (GB); Jumpei Hayashi, Yokohama (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/563,892

(22) PCT Filed: Mar. 24, 2016

(86) PCT No.: PCT/JP2016/001724
§ 371 (c)(1),
(2) Date: Oct. 2, 2017

(87) PCT Pub. No.: WO2016/157855
PCT Pub. Date: Oct. 6, 2016

(65) Prior Publication Data
US 2018/0123018 A1    May 3, 2018

(30) Foreign Application Priority Data
Apr. 3, 2015 (JP) .................................. 2015-077214

(51) Int. Cl.
*H01L 41/04* (2006.01)
*H01L 41/187* (2006.01)
*C04B 35/626* (2006.01)
*H01L 41/083* (2006.01)

(52) U.S. Cl.
CPC .... *H01L 41/1873* (2013.01); *C04B 35/62695* (2013.01); *H01L 41/083* (2013.01)

(58) Field of Classification Search
CPC ....... H01L 41/04; H01L 41/042; H01L 41/08; H01L 41/083
See application file for complete search history.

(56) References Cited

U.S. PATENT DOCUMENTS
2017/0228072 A1*  8/2017  Amin .................... H01L 41/081

FOREIGN PATENT DOCUMENTS
| EP | 1876156 A1 | 1/2008 |
| JP | 2009-227535 A | 10/2009 |
| WO | 2014/119702 A1 | 8/2014 |
| WO | 2015/115279 A1 | 8/2015 |

* cited by examiner

*Primary Examiner* — Hoai V Pham
(74) *Attorney, Agent, or Firm* — Canon U.S.A. Inc., IP Division

(57) ABSTRACT

The piezoelectric material of the present invention includes a main component composed of a perovskite-type metal oxide represented by Formula (1), Zn, and Mg. The content of Zn is 0.005 mol or more and 0.050 mol or less based on 1 mol of the perovskite-type metal oxide, and the content of Mg is 0.001 mol or more and 0.020 mol or less based on 1 mol of the perovskite-type metal oxide.
Formula (1): $(Na_xBa_{1-y})(Nb_yTi_{1-y})O_3$ (where x is 0.83 or more and 0.95 or less, y is 0.85 or more and 0.95 or less, and x/y is 0.95 or more and 1.05 or less).

17 Claims, 14 Drawing Sheets

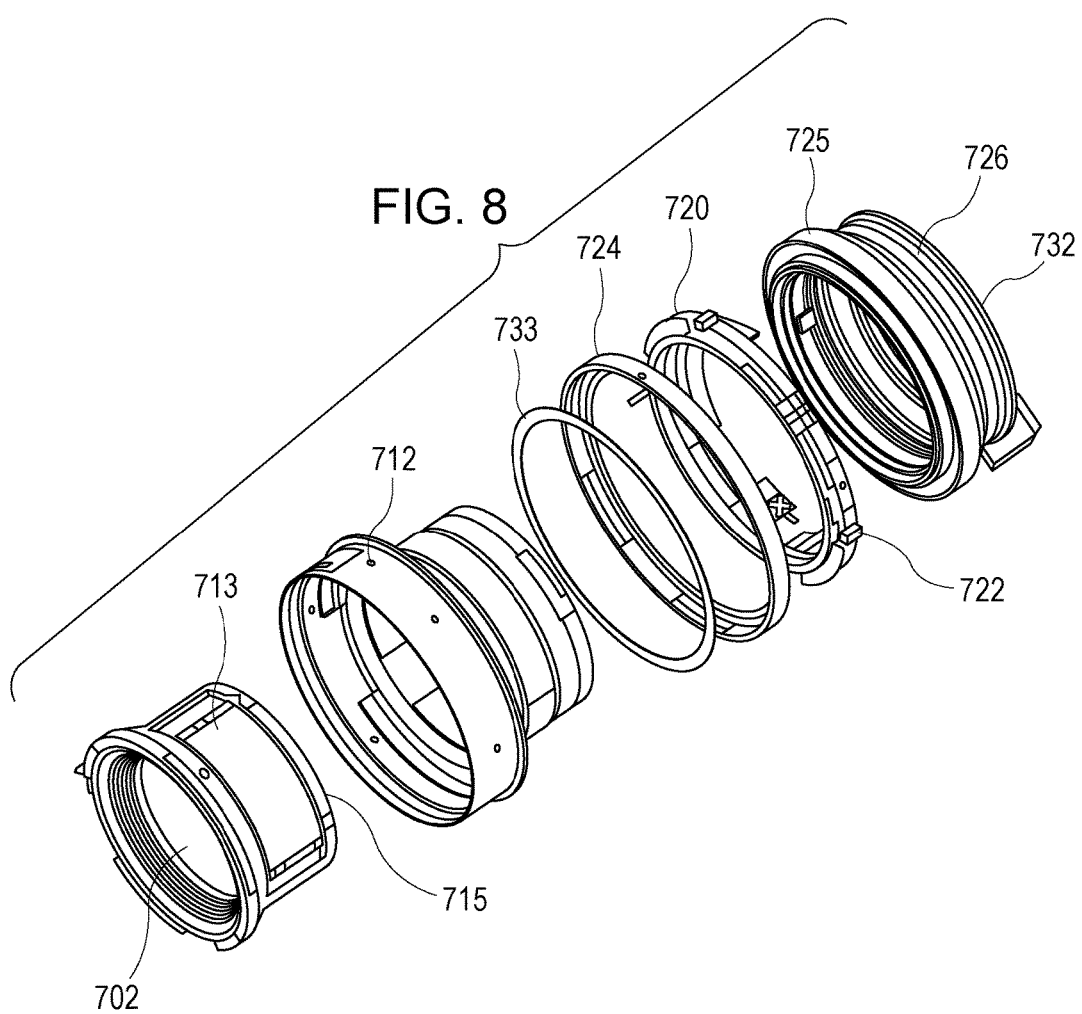

PIEZOELECTRIC MATERIAL, PIEZOELECTRIC ELEMENT, AND ELECTRONIC APPARATUS

CROSS-REFERENCE TO RELATED APPLICATIONS

This application is a National Stage filing of International Application No. PCT/JP2016/001724 filed Mar. 24, 2016, which claims the benefit of Japanese Patent Application No. 2015-077214, filed Apr. 3, 2015, the disclosures of each of which are hereby incorporated by reference herein in their entirety.

TECHNICAL FIELD

The present invention relates to a piezoelectric material, in particular, a lead-free piezoelectric material. The present invention also relates to a piezoelectric element, a layered piezoelectric element, a liquid discharge head, a liquid discharge device, an ultrasonic motor, an optical apparatus, a vibratory device, a dust removing device, an image pickup device, and an electronic apparatus, including the piezoelectric material.

BACKGROUND ART

Piezoelectric materials are generally $ABO_3$ perovskite-type metal oxides such as lead zirconate titanate (hereinafter referred to as "PZT"). PZT contains lead as an A site element, and therefore its influence on environment is viewed as a problem. Accordingly, there is a demand for a piezoelectric ceramic including a lead-free perovskite-type metal oxide.

PTL 1 discloses that the piezoelectric constant is increased by adding cobalt to a piezoelectric ceramic, a solid solution of sodium niobate and barium titanate (hereinafter referred to as "NN-BT"). A composition having a low piezoelectric constant $d_{31}$ of 12 pC/N has a mechanical quality factor $Q_m$ of 1020. However, it is described that a composition having a piezoelectric constant $d_{31}$ of 54 to 56 pC/N (an NN-BT ceramic sample having a barium titanate concentration of 9% to 11%) has a decreased mechanical quality factor $Q_m$ of 250 to 430. It is also disclosed that some of the piezoelectric materials in PTL 1 have deteriorated insulation resistance values of $10^6 \Omega$ or less and are therefore hardly polarized.

CITATION LIST

Patent Literature

PTL 1: Japanese Patent Laid-Open No. 2009-227535

SUMMARY OF INVENTION

Technical Problem

Thus, these known technologies have a difficulty in achieving compatibility between high piezoelectric performance and mechanical quality factor in NN-BT.

The present invention has been made to solve such problems and provides a piezoelectric material not containing lead and potassium and having a high piezoelectric constant and satisfactory insulation properties. The present invention also provides a piezoelectric element, a layered piezoelectric element, a liquid discharge head, a liquid discharge device, an ultrasonic motor, an optical apparatus, a vibratory device, a dust removing device, an image pickup device, and an electronic apparatus, including the piezoelectric material.

Solution to Problem

The piezoelectric material according to aspects of the present invention for solving the above-mentioned problems includes a main component containing a perovskite-type metal oxide represented by Formula (1), a Zn component, and a Mg component. The content of the Zn component is 0.005 mol or more and 0.050 mol or less based on 1 mol of the perovskite-type metal oxide, and the content of the Mg component is 0.001 mol or more and 0.020 mol or less based on 1 mol of the perovskite-type metal oxide.

Formula (1): $(Na_xBa_{1-y})(Nb_yTi_{1-y})O_3$ (where x is 0.83 or more and 0.95 or less, y is 0.85 or more and 0.95 or less, and x/y is 0.95 or more and 1.05 or less).

The piezoelectric element according to an aspect of the present invention at least includes a first electrode, a piezoelectric material member, and a second electrode, wherein the piezoelectric material constituting the piezoelectric material member is the piezoelectric material of the present invention.

The layered piezoelectric element according to an aspect of the present invention is composed of a plurality of piezoelectric material layers and a plurality of electrode layers including at least one internal electrode layer, wherein the piezoelectric material layers and the electrode layers are alternately stacked, and the piezoelectric material layers are made of the piezoelectric material of the present invention.

The liquid discharge head according to an aspect of the present invention at least includes a liquid chamber including a vibratory unit including the piezoelectric element or the layered piezoelectric element of the present invention and a discharge port communicating with the liquid chamber.

The liquid discharge device according to an aspect of the present invention includes a transfer object-holding unit and the liquid discharge head of the present invention.

The ultrasonic motor according to an aspect of the present invention at least includes a vibratory component including the piezoelectric element or the layered piezoelectric element of the present invention and a movable component being in contact with the vibratory component.

The optical apparatus according to an aspect of the present invention includes a driving unit including the ultrasonic motor of the present invention.

The vibratory device according to an aspect of the present invention includes a vibratory component including the piezoelectric element or the layered piezoelectric element of the present invention.

The dust removing device according to an aspect of the present invention includes a vibratory unit provided with the vibratory device of the present invention.

The image pickup device according to an aspect of the present invention at least includes the dust removing device of the present invention and an image pickup element unit, wherein the vibratory member of the dust removing device is disposed on the light-receiving surface side of the image pickup element unit.

The electronic apparatus according to an aspect of the present invention includes a piezoelectric acoustic component including the piezoelectric element or the layered piezoelectric element of the present invention.

Further features of the present invention will become apparent from the following description of exemplary embodiments with reference to the attached drawings.

Advantageous Effects of Invention

The present invention can provide a piezoelectric material not containing lead and potassium and having a high piezoelectric constant and a satisfactory mechanical quality factor. The present invention can also provide a piezoelectric element, a layered piezoelectric element, a liquid discharge head, a liquid discharge device, an ultrasonic motor, an optical apparatus, a vibratory device, a dust removing device, an image pickup device, and an electronic apparatus, including the piezoelectric material.

Since the piezoelectric material of the present invention does not contain lead, its load on the environment is low. The piezoelectric material also does not contain potassium and therefore has excellent sinterability and moisture resistance.

BRIEF DESCRIPTION OF DRAWINGS

FIG. 8 is a schematic diagram illustrating an embodiment of an optical apparatus of the present invention.

DESCRIPTION OF EMBODIMENTS

Figure 1:
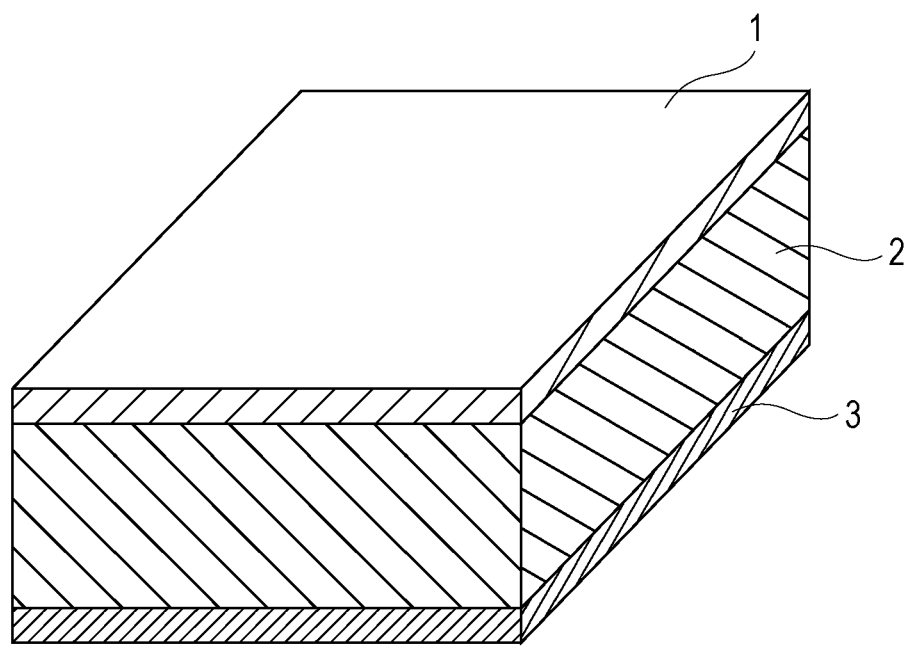
FIG. 1 is a schematic diagram illustrating an embodiment of the configuration of a piezoelectric element of the present invention.

Embodiments of the present invention will now be described.

The present invention provides a piezoelectric material having a basic constitution of a solid solution of sodium niobate and barium titanate (NN-BT piezoelectric material), not containing lead and potassium, and having high mechanical quality factor and piezoelectric constant. The piezoelectric material of the present invention also has high insulation properties.

The term "piezoelectric material not containing lead, potassium, and cobalt (lead-free, potassium-free, and cobalt-free)" means that the contents of these components are each 0 ppm or more and less than 1000 ppm based on 1 mol of the piezoelectric material.

Accordingly, the piezoelectric material of the present invention can be applied to various uses, such as a capacitor, a memory, and a sensor, by utilizing the characteristics as a dielectric.

The piezoelectric material according to the present invention includes a perovskite-type metal oxide represented by Formula (1) as a main component, a Zn component, and a Mg component. The content of the Zn element in the Zn component is 0.005 mol or more and 0.050 mol or less based on 1 mol of the perovskite-type metal oxide, and the content of the Zn element in the Mg component is 0.001 mol or more and 0.020 mol or less based on 1 mol of the perovskite-type metal oxide.

$(Na_xBa_{1-x})(Nb_yTi_{1-y})O_3$ (where x is 0.83 or more and 0.95 or less, y is 0.85 or more and 0.95 or less, and x/y is 0.95 or more and 1.05 or less).

In the present invention, the perovskite-type metal oxide refers to a metal oxide having a perovskite-type structure, which is ideally a cubic crystal structure, as described in Iwanami Dictionary of Physics and Chemistry, 5th Edition (Iwanami Shoten, Published on Feb. 20, 1998). A metal oxide having a perovskite-type structure is generally expressed by a chemical formula: $ABO_3$. In the perovskite-type metal oxide, elements A and B occupy specific unit cell positions called A site and B site, respectively, in the ion forms. For example, in a cubic crystal unit cell, the element A is placed at the vertexes of the cubic, and the element B is placed at the body-centered position of the cubic. The element O occupies the face-centered positions of the cubic as anions of oxygen. The A site element is 12-fold coordinated, and the B site element is 6-fold coordinated. Slight coordinate shifts of the A element, B element, and O element from the symmetry sites of the respective unit cells distort the unit cells of the perovskite-type structure into, for example, a tetragonal, rhombohedral, or orthorhombic crystal system.

In the metal oxide represented by Formula (1), the metal elements positioned at the A site are Na and Ba, and the metal elements positioned at the B site are Nb and Ti. However, a part of the Na and Ba atoms and Zn, Mg, and Mn atoms may be positioned at the B site. Similarly, a part of the Ti and Nb atoms and Zn, Mg, and Mn atoms may be positioned at the A site. In order to readily produce the piezoelectric material of the present invention or to adjust the physical properties of the piezoelectric material of the present invention, a part of the Ba atoms may be replaced with a bivalent metal element, such as Sr or Ca. Similarly, a part of the Nb atoms may be replaced with a pentavalent metal element, such as Ta, within a range of 20 mol % or less. Similarly, a part of the Ti atoms may be replaced with Zr or Sn within a range of 20 mol % or less, and a part of the Na atoms may be replaced with Li within a range of 15 mol % or less. Furthermore, the piezoelectric material may contain 5 mol % or less of Ni element based on 1 mol of the perovskite-type metal oxide represented by Formula (1). Similarly, the piezoelectric material may contain 5 mol % or less of at least one element selected from La, Ce, Pr, Nd, Pm, Sm, Eu, Gd, Tb, Dy, Ho, Er, Tm, and Yb based on 1 mol of the perovskite-type metal oxide represented by Formula (1). Furthermore, the piezoelectric material may contain an accessory component containing at least one selected from Si and B in an amount of 0.001 parts by weight or more and 4.000 parts by weight or less on a metal basis relative to 100 parts by weight of the piezoelectric material.

The molar ratio of the elements on the B site to the element O in Formula (1) is 1:3, but the ratio of the amounts of the elements may slightly shift (for example, from 1.00:2.94 to 1.00:3.06) as long as the perovskite-type structure is the primary phase of the metal oxide. Such a case is also encompassed in the scope of the present invention. The perovskite-type structure of the metal oxide can be confirmed by structural analysis, such as X-ray diffraction or electron beam diffraction.

The piezoelectric material according to the present invention may be in any form, such as a ceramic, a powder, a single crystal, a film, or slurry, and can be in a form of a ceramic. Throughout the specification, the term "ceramic" refers to aggregate (also referred to as bulk body) of crystal grains having a base component of a metal oxide and fired by heat treatment, a so-called polycrystal, and encompasses those processed after sintering.

In Formula (1), "x" representing the amount of Na on the A site can be 0.83 or more and 0.95 or less. An amount x of Na of less than 0.83 causes a deficiency of Na relative to an appropriate amount of Nb, leading to occurrence of an impurity phase (a phase having an X-ray diffraction pattern similar to that of, for example, $Ba_4Nb_2O_9$, $Ba_6Ti_7Nb_9O_{42}$, $Ba_3Nb_4Ti_4O_{21}$, or $Ba_3Nb_{32}Ti_5O_{21}$). The molar ratio (Na/Nb) of Na to Nb may become larger than 1 depending on the composition of the raw material powder or weighing of the raw material powder. The upper limit of the molar ratio (Na/Nb) is 1.05, appropriately, 1.00. The lower limit of the molar ratio (Na/Nb) is 0.95, appropriately, 0.97.

Herein, the term "main component" of a piezoelectric material refers to the majority component for expressing the piezoelectric properties among the various components constituting the piezoelectric material. The molar ratio of the majority component is 51% or more in the piezoelectric material.

The metal oxide sample containing a large impurity phase has a low resistivity of $10^7$ to $10^8$ Ωcm and has a difficulty in polarization treatment. A molar ratio x of Na of higher than 0.95 also reduces the piezoelectricity. A molar ratio x in a range of 0.83 or more and 0.95 or less can prevent occurrence of an impurity phase to provide satisfactory piezoelectricity. The molar ratio x can be 0.83 or more and 0.93 or less, in particular, 0.83 or more and 0.92 or less.

In Formula (1), the molar ratio y of Nb at the B site can be 0.85 or more and 0.95 or less. A molar ratio y of less than 0.85 reduces the Curie temperature to be lower than 140° C., whereas a molar ratio y of higher than 0.95 reduces the piezoelectricity. Accordingly, a molar ratio y in a range of 0.85 or more and 0.95 or less can provide a Curie temperature of 140° C. or more and satisfactory piezoelectricity.

In a molar ratio y in a range of 0.85 or more and 0.95 or less, the Curie temperature is in a range of about 160° C. to 230° C., and the polarization can be readily achieved. Furthermore, in a molar ratio y in a range of 0.88 or more and 0.90 or less, the Curie temperature is in a range of about 190° C. to 230° C. to decrease the risk of a reduction in piezoelectric performance due to heat in the device production step.

The Curie temperature is a temperature, the piezoelectricity of the piezoelectric material being lost at the temperature or more. Throughout the specification, the Curie temperature refers to the temperature showing a maximum dielectric constant in the vicinity of the phase transition temperature between the ferroelectric phase and the paraelectric phase. In addition, the perovskite-type metal oxide of the present invention has a successive phase transition temperature causing successive phase transition from a tetragonal ferroelectric phase to an orthorhombic ferroelectric phase in a temperature range lower than the Curie temperature. The relative dielectric constant becomes the maximum or shows an inflection point at the successive phase transition temperature. Accordingly, as in the Curie temperature, the successive phase transition temperature can also be determined by evaluating the temperature dependability of the relative dielectric constant. For example, a solid solution represented by $0.9(NaNbO_3)-0.1(BaTiO_3)$ causes phase transition from an orthorhombic crystal to a tetragonal crystal and further to a cubic crystal.

The piezoelectric performance becomes the maximum in the vicinity of the successive phase transition temperature. When a constant piezoelectric performance without depending on temperature needs, the successive phase transition is accordingly required not to occur in the device-operating temperature range (for example, −30° C. to 60° C.). In contrast, when a high piezoelectric performance at a specific temperature has higher priority than a piezoelectric performance not depending on temperature, the successive phase transition can be set within the device-deriving temperature range. A material that can adjust the successive phase transition temperature according to the specifications of a device has high versatility and is excellent.

The piezoelectric material of the present invention contains 0.5 mol % or more and 5.0 mol % or less of Zn and 0.1 mol % or more and 2.0 mol % or less of Mg based on 1 mol of the perovskite-type metal oxide represented by Formula (1). Herein, the content of Zn can be 0.5 mol % or more and 2.0 mol % or less. The "mol %" in the amount of Zn or Mg represents the amount ratio of Zn or Mg on a metal basis. The piezoelectric material of the present invention containing 0.5 mol % or more and 5.0 mol % or less of Zn can have enhanced piezoelectric constant, electromechanical coupling factor, Young's modulus, and density and also can decrease the sintering temperature. The sintering temperature is the lowest firing temperature necessary for preparing a sintered compact having a relative density of 95% or more. Furthermore, Zn can decrease the pinning of spontaneous polarization of the piezoelectric material of the present invention. A reduction of pinning increases the remanent polarization value and reduces the coercive electric field in the hysteresis loop of polarization-electric field. Furthermore, polarization treatment readily allows the spontaneous polarization to be in the same direction, causes a larger change in the phase of the impedance at resonance, and increases the electromechanical coupling factor.

Zn may be present at the A site (12-fold coordination), the B site (6-fold coordination), or both of the perovskite structure or may be present at the grain boundaries of the ceramic.

In crystals containing sodium niobate as a component, a light element Na may evaporate or diffuse during sintering, leading to a deficiency of Na relative to Nb in the composition of a sample after sintering. That is, a defect occurs on the A site. However, if a raw material powder contains an excessive amount of a Na raw material, the sintered compact may have reduced insulation properties. Accordingly, a part of the Zn atoms can occupy the A site to compensate for the defect. Alternatively, raw materials may be intentionally weighed such that Na is deficient relative to Nb within a range of 5% or less. The piezoelectric material of the present invention containing 0.1 mol % or more and 2.0 mol % or less of Mg (the molar ratio α is 0.001 or more and 0.020 or less) can increase the mechanical quality factor without reducing the piezoelectric constant. However, a piezoelectric material containing more than 2.0 mol % of Mg has reduced piezoelectricity, whereas an amount of Mg of less than 0.1 mol % cannot provide an effect of increasing the mechanical quality factor.

The piezoelectric material of the present invention can contain a Mn component in addition to the perovskite-type metal oxide, the Zn component, and the Mg component. The content of the Mn element in the Mn component is more than 0 mol % and not higher than 1 mol %, in particular, not higher than 0.5 mol % based on 1 mol of the perovskite-type metal oxide. The "mol %" in the amount of Mn represents the amount ratio of Mn on a metal basis.

The piezoelectric material of the present invention containing 1 mol % or less of Mn can have enhanced resistivity, piezoelectric constant, electromechanical coupling factor, electromechanical quality factor, Young's modulus, and density and also can decrease the sintering temperature. The sintering temperature is the lowest firing temperature necessary for preparing a sintered compact having a relative density of 95% or more. Furthermore, Mn can decrease the pinning of spontaneous polarization of the piezoelectric material of the present invention. A reduction of pinning increases the remanent polarization value and reduces the coercive electric field in the hysteresis loop of polarization-electric field. Furthermore, polarization treatment readily allows the spontaneous polarization to be in the same direction, causes a larger change in the phase of the impedance at resonance, and increases the electromechanical coupling factor.

Mn may be present at the A site (12-fold coordination), the B site (6-fold coordination), or both of the perovskite structure or may be present at the grain boundaries of the ceramic.

In crystals containing sodium niobate as a component, Na may evaporate or diffuse during sintering, leading to a deficiency of Na relative to Nb in the composition of a sample after sintering. That is, a defect occurs on the A site. However, if a raw material powder contains an excessive amount of a Na raw material, the sintered compact may have reduced insulation properties. Accordingly, a part of the Mn atoms can occupy the A site to compensate for the defect. Alternatively, raw materials may be intentionally weighed such that Na is deficient relative to Nb within a range of 5% or less.

When Zn atoms occupy the A site and reduce the crystal defects, at least one of the following effects can be expected:
    (1) an increase in the resistivity;
    (2) an increase in the phase of the impedance at resonance;
    (3) an increase in the remanent polarization value evaluated by measurement of the hysteresis loop of polarization-electric field, or a decrease in the coercive electric field;
    (4) an increase in the electromechanical coupling factor;
    (5) a decrease in the mechanical quality factor;
    (6) a decrease in the Young's modulus; and
    (7) a decrease in the dielectric tangent (tan δ).

In addition, occupation of the B site by Zn atoms forms oxygen defects and also dipole defects to form an internal electric field. Accordingly, a part of Zn atoms may occupy the B site.

When Zn atoms occupy the B site, at least one of the following effects can be expected:
    (1) a decrease in the electromechanical coupling factor or the piezoelectric constant;
    (2) an increase in the mechanical quality factor;
    (3) an increase in the Young's modulus; and
    (4) formation of an internal electric field.

The internal electric field can be evaluated by measuring the hysteresis loop of polarization-electric field. The measured hysteresis loop reveals the coercive electric field (+Ec) when the spontaneous polarization is reversed from negative to positive and the coercive electric field (−Ec) when the spontaneous polarization is reversed from positive to negative. The intensities of +Ec and −Ec are the same in the absence of an internal electric field. In the presence of an internal electric field, the center of the hysteresis loop shifts in the x-axis (electric field axis) direction. The intensity of the internal electric field is the average of the values of +Ec and −Ec. The hysteresis loop can be measured with a commercially available ferroelectric evaluation apparatus. In general, in measurement of a hysteresis loop, an AC electric field of positive and negative triangular or sine waves is applied to a sample. The hysteresis loop is modified by software for centering and is displayed such that the average value of polarization quantities when the positive and negative maximum electric fields are applied is positioned at the zero point of the y-axis.

At least a part of the Zn component is not required to be present at the A site or the B site and can be present at the grain boundaries. The Zn atoms present at the grain boundaries can be as an oxide. The localization of a part of the Zn atoms at the grain boundaries prevents formation of pores, leading to an increase in the mechanical quality factor and an increase in the Young's modulus. In addition, the presence of Zn at the grain boundaries reduces the grain-boundary friction and causes so-called "hardening of the material".

The distribution and the occupation site in crystals of Zn in a sample can be evaluated by electron microscopic observation, energy dispersive X-ray spectrometry, X-ray diffractometry, Raman scattering, or transmission electron microscopic observation.

When Zn is contained in both the A site and the B site, the above-mentioned effects are cumulatively shown. Since the cumulated effects can be controlled by the amount of Zn, Zn may be contained in both the A site and the B site.

When Zn is present at the A site only, since the size of a Zn ion is smaller than those of a Na ion and a Ba ion, the volume of the unit cell is reduced.

The volume of a unit cell can be evaluated by X-ray diffraction.

A piezoelectric material containing more than 5 mol % of Zn based on 1 mol of the perovskite-type metal oxide has a risk of generating an impurity phase and reducing the piezoelectricity.

In Formula (1) representing the piezoelectric material of the present invention, the molar ratio x can be smaller than the molar ratio y. When the molar ratio x is smaller than the molar ratio y, Zn is incorporated into the crystal lattice to readily show the effects of the present invention. Accordingly, the molar ratio x can be smaller than the molar ratio y. In contrast, if the molar ratio x is equal to or higher than the molar ratio y, the insulation properties of the sample is low. Accordingly, an excessively high molar ratio x relative to the molar ratio y is disadvantageous.

Furthermore, a part of Mg atoms can occupy the B site. Replacement of the B site with Mg generates an internal electric field in the ceramic after polarization, prevents the domain wall from vibrating due to an external electric field, and increases the mechanical quality factor. Mg can be present at the grain boundaries. The localization of a part of the Mg atoms at the grain boundaries prevents formation of pores, leading to an increase in the mechanical quality factor. In addition, the presence of a part of the Mg atoms at the grain boundaries reduces the grain-boundary friction and causes so-called "hardening of the material" as described above.

The piezoelectric material of the present invention can be prepared by firing a green compact. A green compact is a solid prepared by molding a raw material powder, in particular, having a higher purity. The molar ratio of Na to Nb contained in the raw material powder can be 0.95 or more and 1.10 or less. Examples of the molding method include uniaxial pressing, cold hydrostatic pressing, hot hydrostatic pressing, casting, and extrusion. The green compact can be produced from a granulated powder. Sintering of the green compact produced from a granulated powder has an advantage that the size distribution of the crystal grains of the sintered compact can be readily uniformized.

The raw material powder of the piezoelectric material may be granulated by any method. In particular, spray drying can be employed from the viewpoint of providing a granulated powder with a more uniform grain diameter.

Examples of the binder that can be used in granulation include polyvinyl alcohol (PVA), polyvinyl butyral (PVB), and acrylic resins. The amount of the binder to be used in granulation can be 1 to 10 parts by weight based on 100 parts by weight of the raw material powder of the piezoelectric material and can be 2 to 5 parts by weight from the viewpoint of increasing the density of the green compact.

The green compact may be sintered by any method. Examples of the sintering include sintering in an electric furnace, sintering in a gas furnace, electrical heating, microwave sintering, millimeter-wave sintering, and hot isostatic pressing (HIP). The electric furnace or the gas furnace for sintering may be a continuous furnace or a batch furnace.

The sintering may be performed at any temperature, and a temperature allowing each compound to react and being sufficient for crystal growth can be particularly employed.

From the viewpoint of controlling the average grain diameter in a range of 0.3 to 100 µm, the sintering temperature can be 1050° C. or more and 1300° C. or less, in particular, 1100° C. or more and 1200° C. or less. The piezoelectric material sintered in such a temperature range shows satisfactory piezoelectric performance. In order to stably reproduce the properties of piezoelectric materials prepared by sintering, the sintering is performed at a constant temperature within the above-mentioned range for 2 to 48 hours. Although sintering such as two-stage sintering may be employed, a method that does not involve a rapid temperature change can be employed in light of productivity.

The piezoelectric material prepared by sintering is polished and can then be heated at a temperature of the Curie temperature or more. Although the mechanical polishing generates a residual stress inside the piezoelectric material, the heat treatment at the Curie temperature or more relieves the residual stress to further enhance the piezoelectric properties of the piezoelectric material. The heat treatment may be performed for any period of time, for example, 1 hour or more.

If a piezoelectric material of the present invention has a crystal grain diameter of larger than 100 µm, the strength of the piezoelectric material may be insufficient for undergoing cutting processing and polishing processing. In contrast, a grain diameter of smaller than 0.3 µm decreases the piezoelectricity. Accordingly, regarding the grain diameter range, the average grain diameter can be 0.3 µm or more and 100 µm or less, in particular, 0.5 µm or more and 70 µm or less.

When the piezoelectric material of the present invention is used as a film formed on a substrate, the piezoelectric material can have a thickness of 200 nm or more and 10 µm or less, in particular, 300 nm or more and 3 µm or less. A piezoelectric material having a thickness of 200 nm or more and 10 µm or less can provide an electromechanical conversion function sufficient as a piezoelectric element.

The film may be stacked by any process. For example, chemical solution deposition (CSD), a sol-gel method, metal organic chemical vapor deposition (MOCVD), sputtering, pulsed laser deposition (PLD), hydrothermal synthesis, or aerosol deposition (AD) can be employed. In particular, chemical solution deposition or sputtering can be employed. Chemical solution deposition or sputtering can readily form a film having a large area. The substrate on which the piezoelectric material of the present invention is formed can be a single-crystal substrate cut and polished along the (001) plane or (110) plane. The use of a single-crystal substrate cut and polished along a specific crystal plane can strongly orient the piezoelectric material film formed on the surface of the substrate in the same direction.

(Piezoelectric Element)

A piezoelectric element including the piezoelectric material of the present invention will now be described.

FIG. 1 is a schematic diagram illustrating an embodiment of the configuration of a piezoelectric element of the present invention. The piezoelectric element according to the present invention at least includes a first electrode 1, a piezoelectric material member 2, and a second electrode 3. The piezoelectric material constituting the piezoelectric material member 2 is the piezoelectric material of the present invention.

The piezoelectric properties of the piezoelectric material according to the present invention can be evaluated by producing a piezoelectric element at least having a first electrode and a second electrode. The first and the second electrodes are conductive layers having a thickness of about 5 nm to 10 µm. Each electrode may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, or sputtering or vapor deposition. The first and the second electrodes may be each patterned into a desired shape.

In the piezoelectric element, the polarization axes can be aligned in the same direction. A piezoelectric element having polarization axes aligned in the same direction has an enhanced piezoelectric constant.

The piezoelectric element may be polarized by any method. The polarization treatment may be performed in the atmosphere or in an oil. The temperature for the polarization can be 60° C. to 160° C. The optimum conditions for the polarization slightly vary depending on the composition of the piezoelectric material constituting the element. The electric field applied for the polarization treatment can be higher than the coercive electric field of the material, specifically, from 1 to 5 kV/mm.

The piezoelectric constant and the electromechanical quality factor of the piezoelectric element can be determined by calculation based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

(Layered Piezoelectric Element)

The layered piezoelectric element including the piezoelectric material of the present invention will now be described.

The layered piezoelectric element according to the present invention is composed of a plurality of piezoelectric material layers and a plurality of electrode layers including at least one internal electrode layer, which are alternately stacked. The piezoelectric material layers are made of the piezoelectric material of the present invention.

Figure 2A:
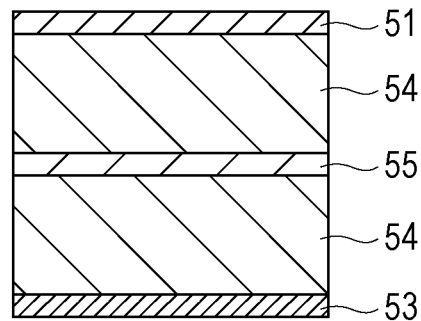
FIG. 2A is a schematic cross-sectional diagram illustrating an embodiment of the configuration of a layered piezoelectric element of the present invention.
Figure 2B:
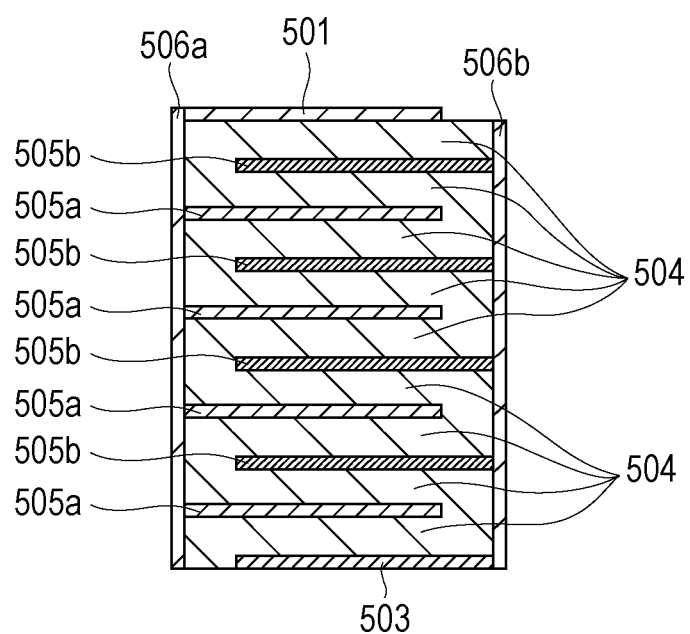
FIG. 2B is a schematic cross-sectional diagram illustrating another embodiment of the configuration of a layered piezoelectric element of the present invention.

FIGS. 2A and 2B are schematic cross-sectional diagrams illustrating embodiments of the configuration of a layered piezoelectric element of the present invention. The layered piezoelectric element according to the present invention is constituted of piezoelectric material layers 54 and electrode layers including an internal electrode layer 55, wherein the piezoelectric material layers and the laminar electrodes are alternately stacked. The piezoelectric material layers 54 are made of the piezoelectric material. The electrode layers may include external electrodes such as a first electrode 51 and a second electrode 53, in addition to the internal electrode layer 55.

FIG. 2A shows a configuration of a layered piezoelectric element of the present invention including a layered product 56 composed of two piezoelectric material layers 54 and one internal electrode layer 55, which are alternately stacked between the first electrode 51 and the second electrode 53. The numbers of the piezoelectric material layers and the internal electrode layers are not, however, limited and may be increased as shown in FIG. 2B. The layered piezoelectric element shown in FIG. 2B has a structure composed of nine piezoelectric material layers 504 and eight internal electrode layers 505 (505a or 505b), which are alternately stacked between the first electrode 501 and the second electrode 503. The layered piezoelectric element includes an external electrode 506a and an external electrode 506b for short-circuiting the alternately disposed internal electrode layers.

The sizes and the shapes of the internal electrode layers 55, 505 and the external electrodes 506a, 506b are not necessarily the same as those of the piezoelectric material layers 54, 504 and may be divided into two or more pieces.

The internal electrode layers 55, 505, the external electrodes 506a, 506b, the first electrode 51, 501, and the second electrode 53, 503 are conductive layers having a thickness of about 5 to 2000 nm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrode layers 55, 505 and the external electrodes 506a, 506b may be each made of any one of these materials or a mixture or alloy of two or more of these materials or may be each a multilayer made of two or more of these materials. These electrodes may be made of different materials from one another. From the viewpoint of inexpensive electrode materials, the internal electrode layers 55, 505 can contain at least one of Ni and Cu. In the case of the internal electrode layers 55, 505 containing at least one of Ni and Cu, the layered piezoelectric element of the present invention can be fired in a reducing atmosphere.

In the layered piezoelectric element of the present invention, the internal electrode layers contain Ag and Pd, and the weight ratio M1/M2 of the weight M1 of Ag to the weight M2 of Pd can be 1.5 or more and 9.0 or less, in particular, 2.3 or more and 4.0 or less. A weight ratio M1/M2 of less than 1.5 disadvantageously increases the sintering temperature of the internal electrode layers. In contrast, a weight ratio M1/M2 of higher than 9.0 disadvantageously forms island-like internal electrode layers and to make the surface uneven.

As shown in FIG. 2B, a plurality of electrodes including the internal electrode layers 505 may be short-circuited to each other for adjusting the phase of the driving voltage. For example, the internal electrode layers 505a and the first electrode 501 may be short-circuited with the external electrode 506a. The short circuit between electrodes may be performed by any form. An electrode or wiring for short circuit may be disposed on the side of the layered piezoelectric element. Alternatively, electrodes may be short-circuited with a conductive material disposed inside a through-hole formed so as to pass through the piezoelectric material layers 504.

(Liquid Discharge Head)

The liquid discharge head according to the present invention at least includes a liquid chamber provided with a vibratory unit including the piezoelectric element or the layered piezoelectric element and a discharge port communicating with the liquid chamber. The liquid to be discharged by the liquid discharge head of the present invention may be any fluid, and examples thereof include aqueous liquids and non-aqueous liquids, such as water, ink, and fuel.

Figure 3A:
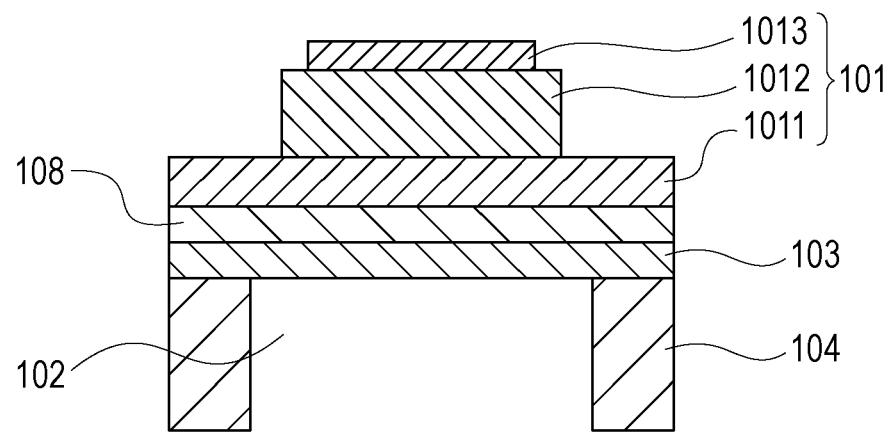
FIG. 3A is a schematic diagram illustrating an embodiment of the configuration of a liquid discharge head of the present invention.
Figure 3B:
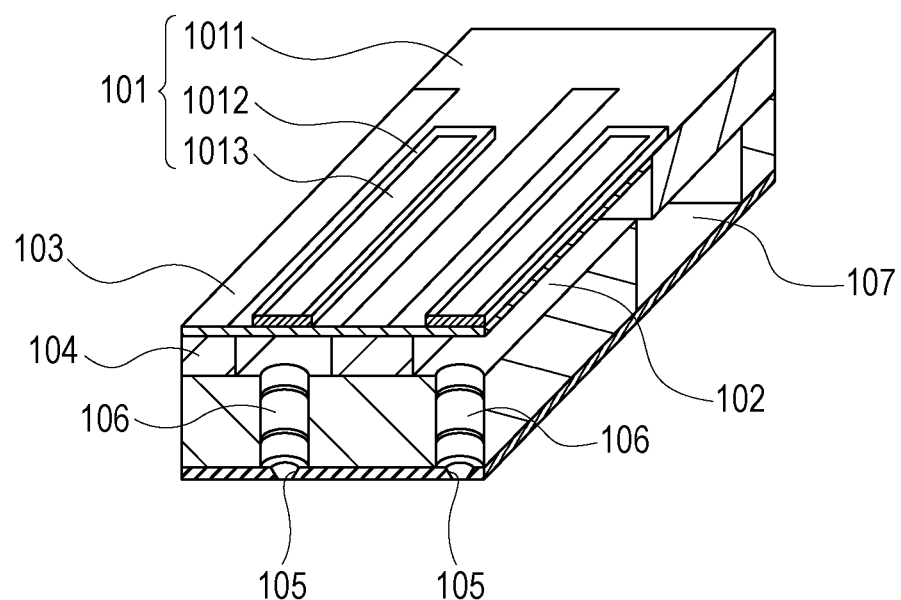
FIG. 3B is another schematic diagram illustrating the embodiment of the configuration of a liquid discharge head of the present invention.

FIGS. 3A and 3B are schematic diagrams illustrating an embodiment of the configuration of a liquid discharge head of the present invention. As shown in FIGS. 3A and 3B, the liquid discharge head of the present invention includes a piezoelectric element 101 of the present invention. The piezoelectric element 101 at least includes a first electrode 1011, a piezoelectric material 1012, and a second electrode 1013. The piezoelectric material 1012 is optionally patterned as shown in FIG. 3B.

FIG. 3B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric elements 101 shown in FIG. 3B each have a rectangular shape, but may have any shape such as an elliptical, circular, or parallelogram shape. In general, the piezoelectric material 1012 has a shape along the shape of the individual liquid chamber 102.

The vicinity of the piezoelectric element 101 in the liquid discharge head of the present invention will be described in detail with reference to FIG. 3A. FIG. 3A is a cross-sectional view in the width direction of the piezoelectric element shown in FIG. 3B. The cross section of the piezoelectric element 101 is rectangular, but may be trapezoidal or reverse trapezoidal.

In the drawing, the first electrode 1011 is used as a lower electrode, and the second electrode 1013 is used as an upper electrode. The arrangement of the first electrode 1011 and the second electrode 1013 is not limited to this. For example, the first electrode 1011 may be used as a lower electrode or may be used as an upper electrode. Likewise, the second electrode 1013 may be used as an upper electrode or may be used as a lower electrode. In addition, a buffer layer 108 may be disposed between the diaphragm 103 and the lower electrode. These differences in name are due to the difference in method of producing the devices, and the effects of the present invention can be achieved in any of these cases.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head of the present invention can be used in printers or can be applied to production of electronic devices. The diaphragm 103 can have a thickness of 1.0 μm or more and 15 μm or less, in particular, 1.5 μm or more and 8 μm or less. The diaphragm may be made of any material. For example, the diaphragm can be made of Si. The Si may be doped with boron or phosphorus. In addition, the buffer layer or the electrode layer on the diaphragm may be a part of the diaphragm. The buffer layer 108 can have a thickness of 5 nm or more and 300 nm or less, in particular, 10 nm or more and 200 nm or less. The discharge port 105 has a size of 5 μm or more and 40 μm or less as the equivalent circle diameter. The discharge port 105 may be circular or may have a star, square, or triangle shape.

(Liquid Discharge Device)

The liquid discharge device of the present invention will now be described. The liquid discharge device of the present invention includes a conveying unit serving as a transfer object-holding unit and the liquid discharge head.

Figure 4:
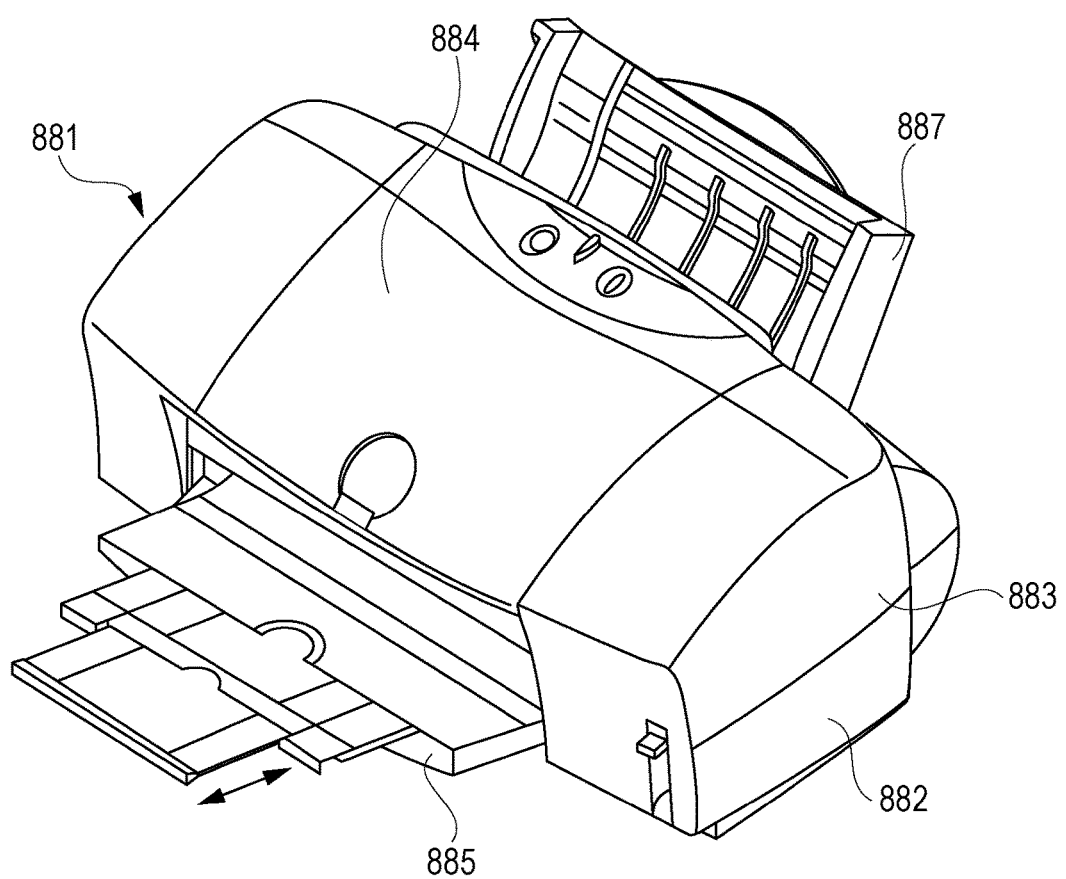
FIG. 4 is a schematic diagram illustrating an embodiment of a liquid discharge device of the present invention.
Figure 5:
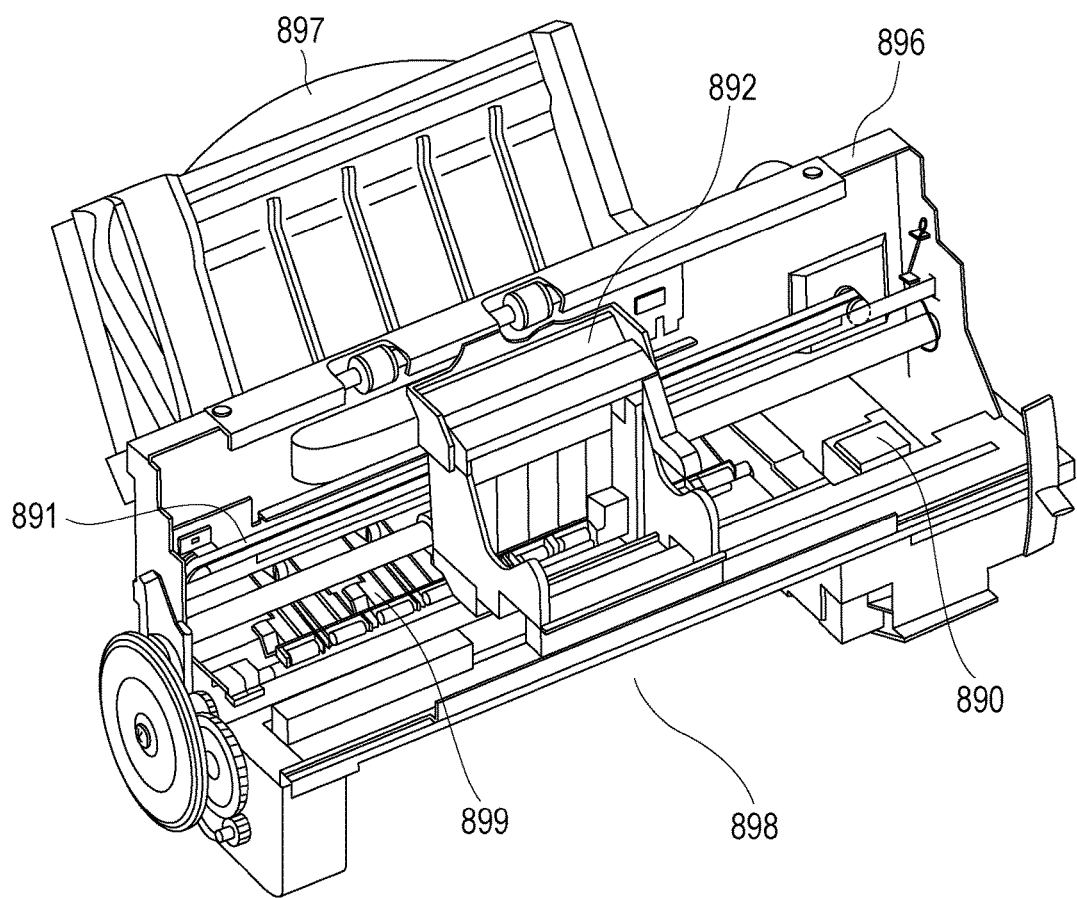
FIG. 5 is a schematic diagram illustrating an embodiment of a liquid discharge device of the present invention.

The ink-jet recording apparatus shown in FIGS. 4 and 5 is an example of the liquid discharge device of the present invention. FIG. 5 shows the liquid discharge device (ink-jet recording apparatus) 881 shown in FIG. 4 in a state where the exteriors 882 to 885 and 887 are removed. The ink-jet recording apparatus 881 includes an automatic feeder 897 for automatically feeding recoding paper as the transfer object in the device main body 896. The ink-jet recording apparatus 881 further includes a conveying unit 899 serving as a transfer object-holding unit for conveying the recording paper fed from the automatic feeder 897 to a predetermined recording position and then conveying the recording paper from the recording position to the ejection port 898. The ink-jet recording apparatus 881 further includes a recording unit 891 for performing recording on the recording paper conveyed to the recording position and a recovering unit 890 for performing recovering treatment to the recording unit 891. The recording unit 891 is provided with a carriage 892 that receives the liquid discharge head of the present invention and moves on a rail in a reciprocating motion.

In such an ink-jet recording apparatus, the carriage 892 slides on the rail according to the electric signals sent from a computer, and a driving voltage is applied to electrodes to displace the piezoelectric material disposed between the electrodes. The displacement of the piezoelectric material applies a pressure to the individual liquid chamber 102 via the diaphragm 103 shown in FIG. 3B, and thereby an ink is discharged from the discharge port 105 to perform printing. The liquid discharge device of the present invention can uniformly discharge a liquid at high speed and can be reduced in the size.

The above-described example is a printer, but the liquid discharge device of the present invention can be used not only as an ink-jet recording apparatus, such as a facsimile machine, a multifunction machine, or a copier, but also as a liquid discharge device in industrial use or a drawing apparatus for an object.

In addition, a user can select a desired transfer object depending on the use. A configuration in which the liquid discharge head moves relative to the transfer object placed on a stage serving as the holding unit may be employed.

(Ultrasonic Motor)

Figure 6A:
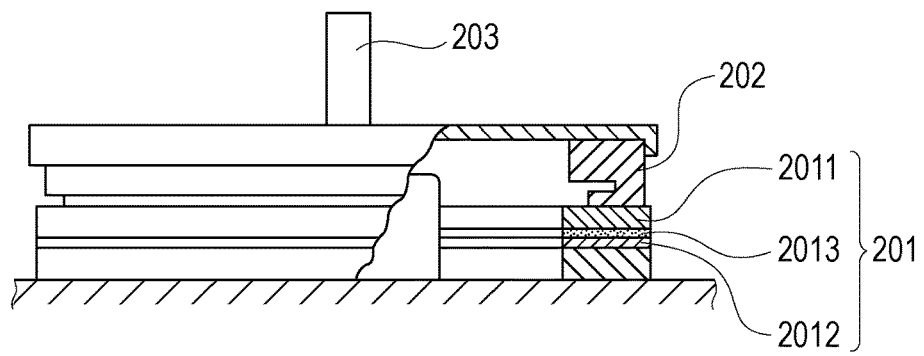
FIG. 6A is a schematic diagram illustrating an embodiment of the configuration of an ultrasonic motor of the present invention.
Figure 6B:
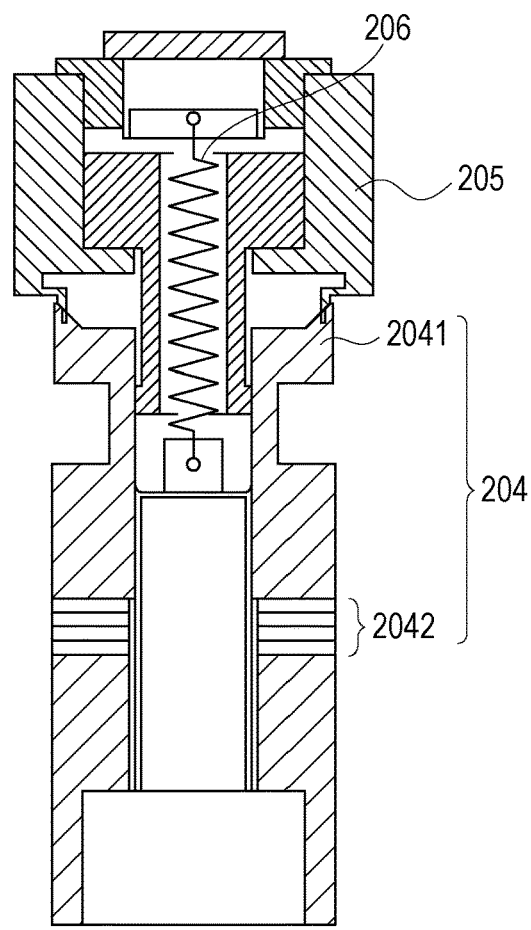
FIG. 6B is another schematic diagram illustrating the embodiment of the configuration of an ultrasonic motor of the present invention.

The ultrasonic motor according to the present invention at least includes a vibratory component including the piezoelectric element or the layered piezoelectric element and a movable component being in contact with the vibratory component. FIGS. 6A and 6B are schematic diagrams illustrating an embodiment of the configuration of an ultrasonic motor of the present invention. FIG. 6A shows an ultrasonic motor including a single plate piezoelectric element of the present invention. The ultrasonic motor includes an oscillator 201, a rotor 202 being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 of the present invention, and an organic adhesive (e.g., epoxy or cyanoacrylate adhesive) 2013 for bonding the piezoelectric element 2012 to the elastic ring 2011. The piezoelectric element 2012 of the present invention is constituted of a first electrode, a second electrode (both are not shown), and the piezoelectric material disposed between the electrodes.

When a two-phase AC voltage different in phase by odd number times $\pi/2$ is applied to the piezoelectric element of the present invention, flexural traveling waves are generated in the oscillator 201, and each point on the sliding surface of the oscillator 201 moves in an elliptic motion. The rotor 202 pressed to the sliding surface of the oscillator 201 receives a frictional force from the oscillator 201 to rotate in the direction opposite to the flexural traveling waves. The object (not shown) to be driven is connected to the output shaft 203 and is driven by the turning force of the rotor 202. Application of a voltage to a piezoelectric material expands and contracts the piezoelectric material by the transverse piezoelectric effect. When an elastic material such as a metal is in contact with the piezoelectric element, the elastic material is bent by the expansion and contraction of the piezoelectric material. The ultrasonic motor described here utilizes this principle.

FIG. 6B shows an example of an ultrasonic motor including a piezoelectric element having a layered structure. The oscillator 204 is composed of a tubular metal elastic bodies 2041 and a layered piezoelectric element 2042 disposed between the elastic bodies. The layered piezoelectric element 2042 is constituted of a plurality of stacked piezoelectric material layers (not shown) and includes first and second electrodes on the outer surfaces of the stacked piezoelectric material layers and internal electrode layers between the stacked piezoelectric material layers. The metal elastic bodies 2041 are connected to each other with a bolt to fix the piezoelectric element 2042 therebetween to form the oscillator 204. Application of an AC voltage different in phase to the piezoelectric element 2042 generates two vibrations rectangular to each other in the oscillator 204. The two vibrations are combined to create a circular vibration for driving the end portion of the oscillator 204. The oscillator 204 is provided with a circumferential groove at the upper portion to enlarge the displacement of the vibration for driving. The rotor 205 is in pressurized contact with the oscillator 204 by means of the pressurizing spring 206 to create a frictional force for driving. The rotor 205 is rotatably supported by bearing.

(Optical Apparatus)

The optical apparatus of the present invention will now be described. The optical apparatus of the present invention includes a driving unit including the ultrasonic motor.

Figure 7A:
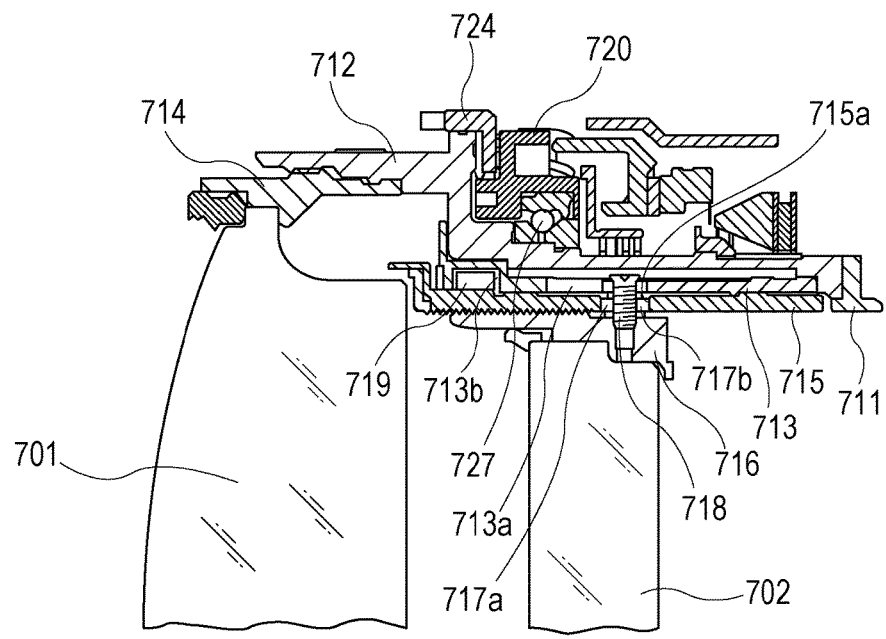
FIG. 7A is a schematic diagram illustrating an embodiment of an optical apparatus of the present invention.
Figure 7B:
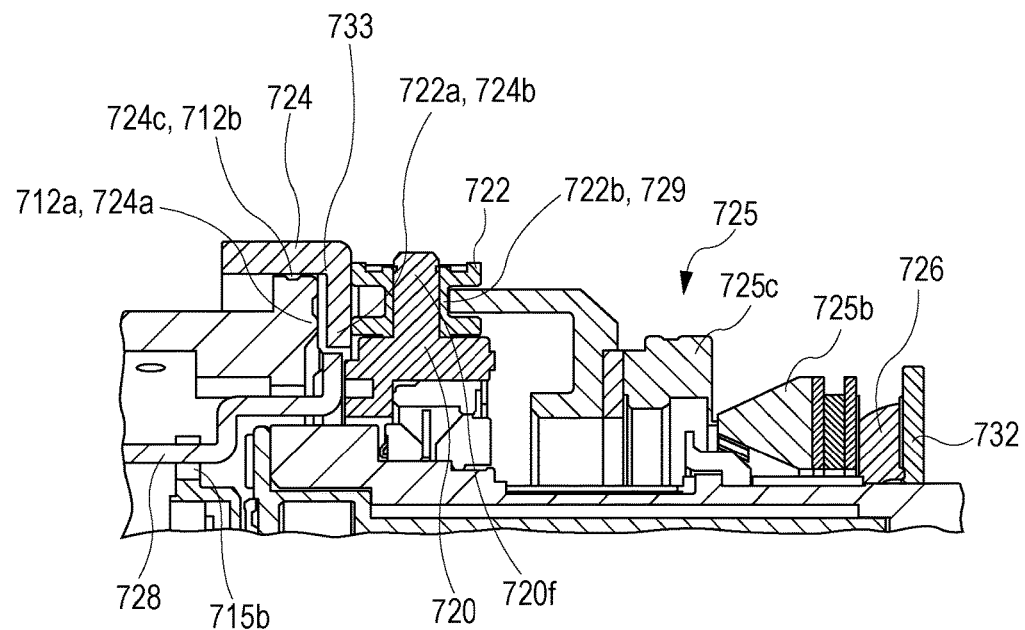
FIG. 7B is another schematic diagram illustrating the embodiment of an optical apparatus of the present invention.

FIGS. 7A and 7B are main cross-sectional views of an interchangeable lens barrel of a single lens reflex camera as an embodiment of the optical apparatus of the present invention. FIG. 8 is an exploded perspective view of an interchangeable lens barrel of a single lens reflex camera as an embodiment of the optical apparatus of the present invention. A fixing barrel 712, a linear guide barrel 713, and a front lens group barrel 714 are fixed to the detachable camera mount 711. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. The linear guide barrel 713 and the cam ring 715 are restricted from relative displacement in the optical axis direction by fitting the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

A low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 around the optical axis with respect to the fixing barrel 712.

The large-diameter portion 722a of the driven roller 722 and the mount side end face 724b of the manual focus ring are in contact with each other with a pressure caused by the force of a wave washer 726 for pressing the ultrasonic motor 725 toward the front of the lens. Similarly, the small-diameter portion 722b of the driven roller 722 and the connecting member 729 are in contact with each other with an appropriate pressure caused by the force of the wave washer 726 for pressing the ultrasonic motor 725 toward the front of the lens. The wave washer 726 is restricted from movement toward the mount direction by a washer 732 bayonet-connected to the fixing barrel 712. The spring force (biasing force) generated by the wave washer 726 is transmitted to the ultrasonic motor 725 and further to the driven roller 722 and thereby also serves as a force of the manual focus ring 724 pressing the mount side end face 712a of the fixing barrel 712. That is, the manual focus ring 724 is incorporated in a state of being pressed to the mount side end face 712a of the fixing barrel 712 via the low friction sheet 733.

Consequently, when the ultrasonic motor 725 is driven so as to turn with respect to the fixing barrel 712 by a controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

When a turning force around the optical axis is applied to the manual focus ring 724 from a manual manipulation input unit (not shown), since the mount side end face 724b of the manual focus ring 724 is in a pressing-contact with the large-diameter portion 722a of the driven roller 722, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from turning (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation transmits the turning force to the cam ring 715 via the focus keys 728 to turn the cam ring around the optical axis. As a result, the rear lens group barrel 716 that is restricted in turning by the cam roller 717a and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of the optical apparatus of the present invention. The present invention can be applied to any optical apparatus having an ultrasonic motor in the driving unit, such as a compact camera, an electronic still camera, or a portable terminal with a camera, regardless of the types of cameras.

(Vibratory Device and Dust Removing Device)

Vibratory devices for, for example, conveying or removing particles, powder, or droplets are widely used in electronic apparatuses.

A dust removing device including the piezoelectric element of the present invention will now be described as an example of the vibratory device of the present invention. The vibratory device according to the present invention includes a vibratory component including the piezoelectric element or the layered piezoelectric element. The dust removing device according to the present invention includes a vibratory component having a diaphragm provided with the piezoelectric element or the layered piezoelectric element.

Figure 9A:
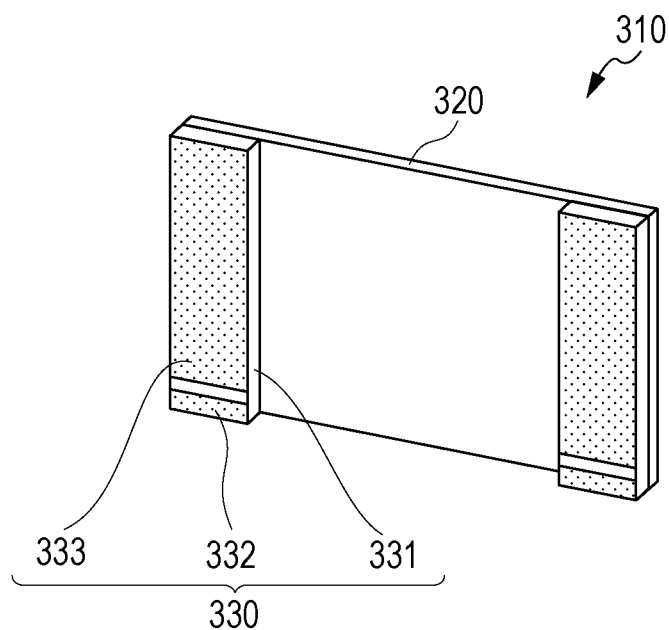
FIG. 9A is a schematic diagram illustrating an embodiment of a vibratory device of the present invention used as a dust removing device.
Figure 9B:
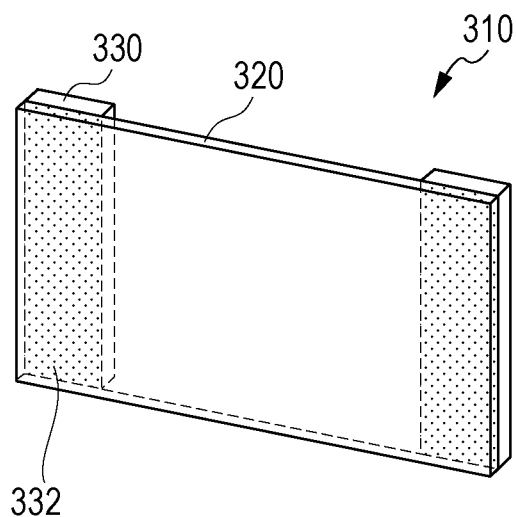
FIG. 9B is another schematic diagram illustrating the embodiment of a vibratory device of the present invention used as a dust removing device.

FIGS. 9A and 9B are schematic diagrams illustrating an embodiment of the dust removing device of the present invention. The dust removing device 310 is constituted of a tabular piezoelectric element 330 and a diaphragm 320. The piezoelectric element 330 may be a layered piezoelectric element of the present invention. The diaphragm 320 may be made of any material. When the dust removing device 310 is used in an optical device, a transparent material or a light-reflective material can be used for the diaphragm 320.

Figure 10A:
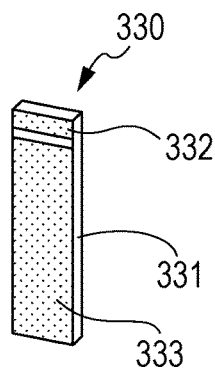
FIG. 10A is a schematic diagram illustrating the configuration of a piezoelectric element in a dust removing device of the present invention.
Figure 10B:
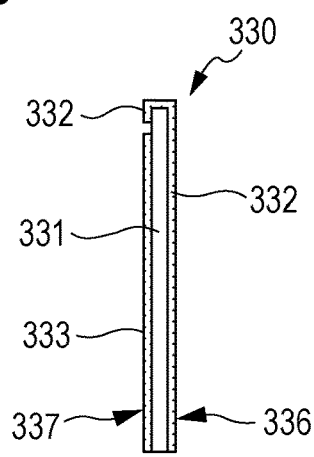
FIG. 10B is a schematic diagram illustrating the configuration of the piezoelectric element in a dust removing device of the present invention.
Figure 10C:
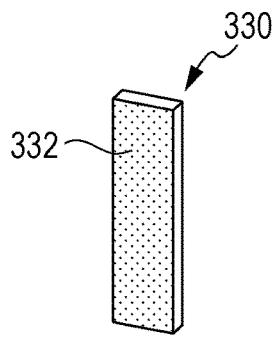
FIG. 10C is a schematic diagram illustrating the configuration of the piezoelectric element in a dust removing device of the present invention.

FIGS. 10A to 10C are schematic diagrams illustrating the configuration of a piezoelectric element 330 shown in FIGS. 9A and 9B. FIGS. 10A and 10C illustrate the structures of the front and the rear faces of the piezoelectric element 330, and FIG. 10B illustrates the structure of the side face. As shown in FIGS. 9A and 9B, the piezoelectric element 330 is composed of a piezoelectric material 331, a first electrode 332, and a second electrode 333. The first electrode 332 and the second electrode 333 are respectively arranged on the surfaces of the tabular piezoelectric material 331 so as to oppose each other. As in the piezoelectric element shown in FIGS. 9A and 9B, the piezoelectric element 330 may be a layered piezoelectric element of the present invention. In such a case, the piezoelectric material 331 has a structure of alternately arranged piezoelectric material layers and internal electrode layers, and the internal electrode layers are alternately short-circuited with the first electrode 332 or the second electrode 333 to give a driving waveform to each layer of the piezoelectric material with different phases. The face of the first electrode 332 of the piezoelectric element 330 shown in FIG. 10C is a first electrode face 336, and the face of the second electrode 333 of the piezoelectric element 330 shown in FIG. 10A is a second electrode face 337.

In the present invention, the term "the electrode face" refers to the face of the piezoelectric element on which the electrode is disposed. For example, as shown in FIGS. 10A to 10C, the first electrode 332 may go around to the second electrode face 337.

As shown in FIGS. 9A and 9B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust removing device 310 of the present invention is a device for removing foreign substance such as dust adhered to the surface of the diaphragm 320 by the out-of-plane vibration of the diaphragm 320. The term "out-of-plane vibration" refers to elastic vibration that displaces the diaphragm in the optical axis direction, i.e., in the thickness direction of the diaphragm.

Figure 11:
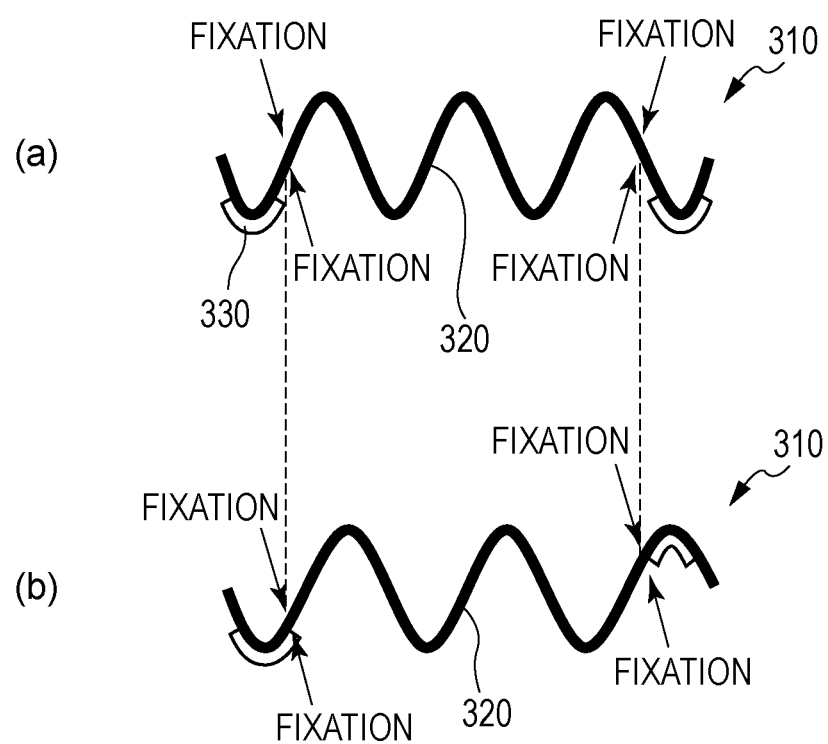
FIG. 11 includes schematic diagrams illustrating the vibration principle of a dust removing device of the present invention.

FIG. 11 includes schematic diagrams illustrating the vibration principle of the dust removing device 310 of the present invention. FIG. 11(a) shows a state of generating out-of-plane vibration in the diaphragm 320 by applying an in-phase AC voltage to a pair of piezoelectric elements 330. The polarization direction of the piezoelectric material constituting the pair of piezoelectric elements 330 is identical with the thickness direction of the piezoelectric elements 330. The dust removing device 310 is driven by a seventh vibration mode. FIG. 11(b) shows a state of generating out-of-plane vibration in the diaphragm 320 by applying a reverse-phase AC voltage having a phase opposite by 180° to a pair of piezoelectric elements 330. The dust removing device 310 is driven by a sixth vibration mode. The dust removing device 310 of the present invention can effectively remove dust adhered to the surface of a diaphragm by properly using at least two vibration modes.

(Image Pickup Device)

Figure 12:
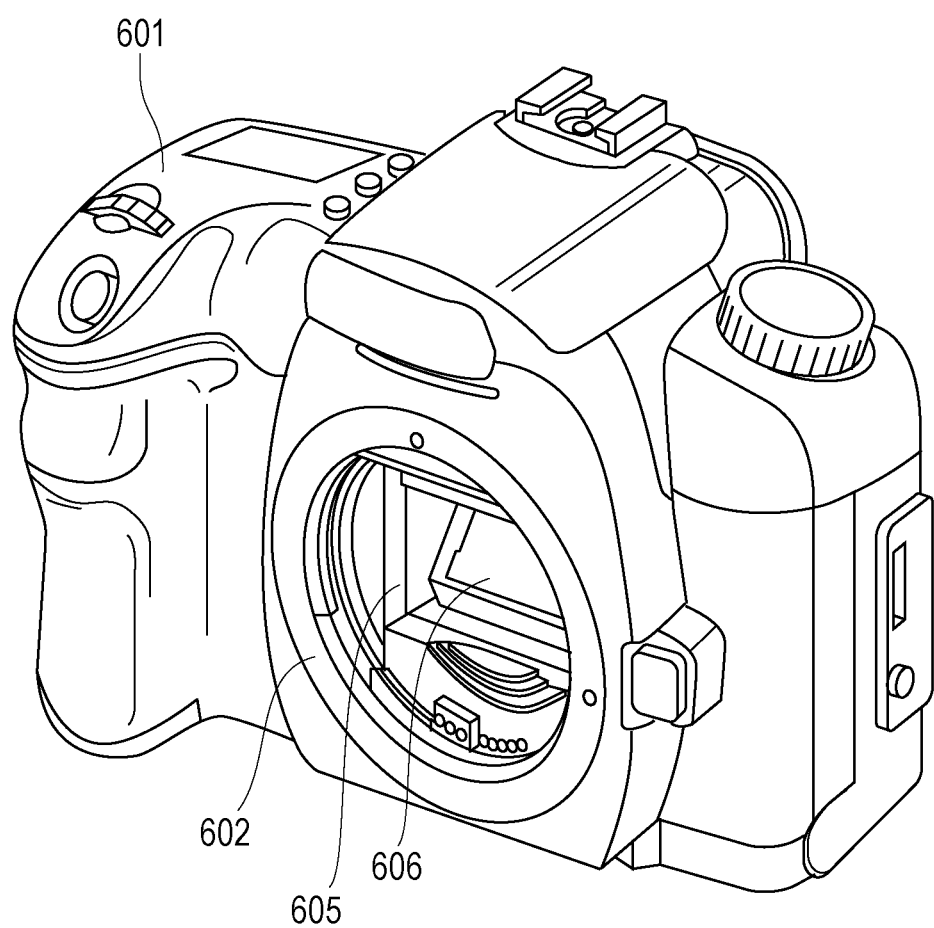
FIG. 12 is a schematic diagram illustrating an embodiment of an image pickup device of the present invention.
Figure 13:
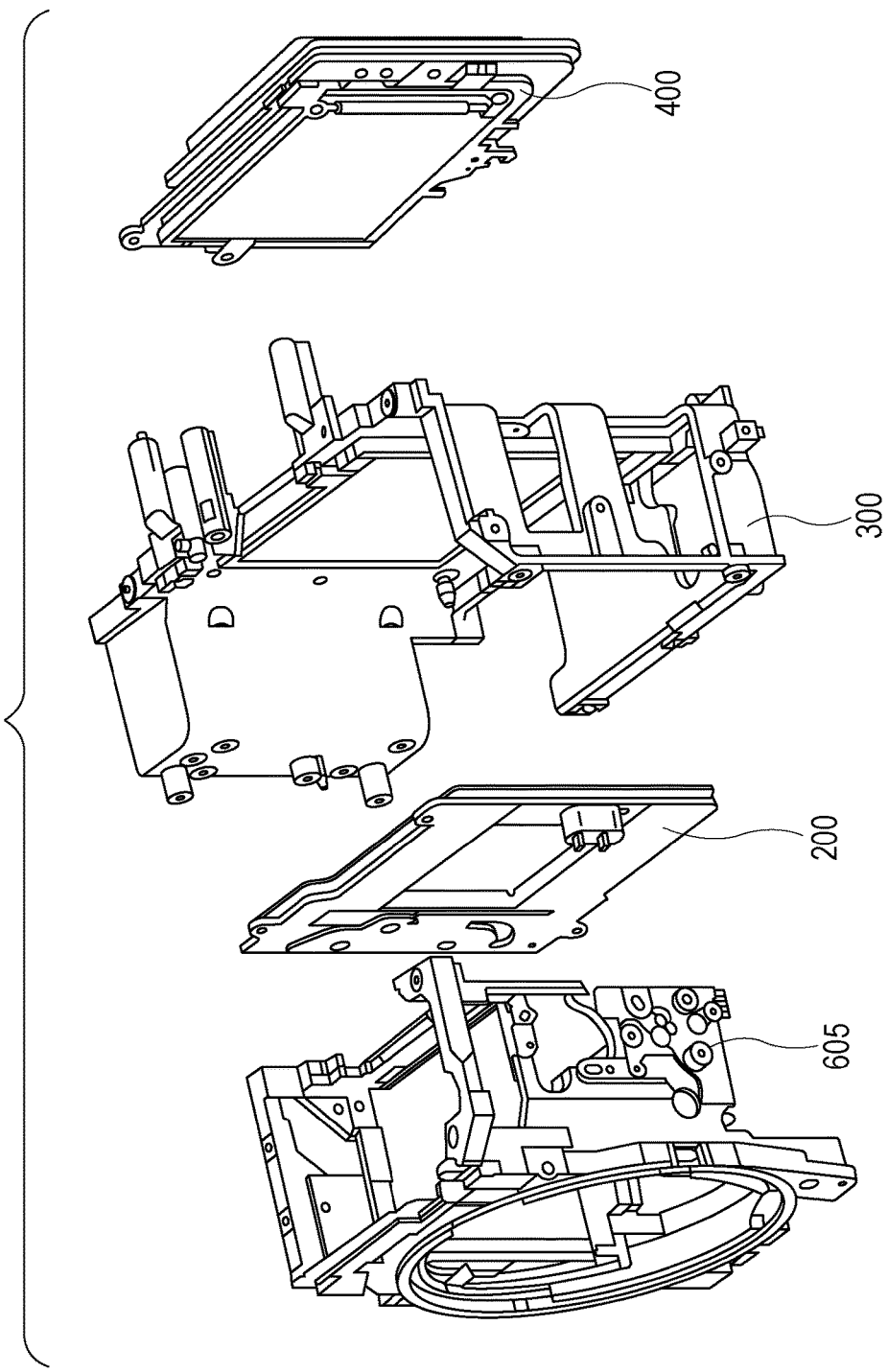
FIG. 13 is a schematic diagram illustrating an embodiment of an image pickup device of the present invention.

The image pickup device of the present invention will now be described. The image pickup device of the present invention at least includes the dust removing device and an image pickup element unit and has the diaphragm of the dust removing device on the light-receiving surface side of the image pickup element unit. FIGS. 12 and 13 are diagrams illustrating a digital single lens reflex camera as an embodiment of the image pickup device of the present invention.

FIG. 12 is a front perspective view of a camera body 601 viewed from the object side, in a state in which the image pickup lens unit is removed. FIG. 13 is an exploded perspective view schematically illustrating the structure of the inside of the camera for describing the dust removing device of the present invention and the surrounding structure of a pickup unit 400.

A mirror box 605 is disposed in the camera body 601, and a main mirror (quick return mirror) 606 is disposed in the mirror box 605. Image pickup light beams passed through the image pickup lens are guided into the mirror box 605. The main mirror 606 can take a state being held at an angle of 45° with respect to the image pickup optical axis for guiding image pickup light beams to the direction of the penta roof mirror (not shown) and a state being held at a position evacuated from image pickup light beams for guiding the image pickup light beams to the direction of the image pickup element (not shown).

On the object side of the body chassis 300 serving as the skeleton of the camera body, the mirror box 605 and a shutter unit 200 are disposed in this order from the object side. Furthermore, an image pickup unit 400 is disposed on the photographer side of the body chassis 300. The image pickup unit 400 is set to the clamp face of the mount portion 602 serving as the basis for setting the image pickup lens unit such that the image pickup face of the image pickup element is parallel to the clamp face with a predetermined distance therebetween.

The image pickup unit 400 is composed of the vibratory member of a dust removing device and an image pickup element unit. The vibratory member of the dust removing device and the light-receiving surface of the image pickup element unit are disposed on the same axis.

Herein, a digital single lens reflex camera has been described as an example of the image pickup device of the present invention. The image pickup device may be, for example, an image pickup lens interchangeable camera such as a mirror-less digital single lens camera not having the mirror box 605. The present invention can also be applied to any apparatus required to remove dust adhering to the surfaces of, in particular, the optical parts of various image pickup devices, such as image pickup unit interchangeable video cameras, copiers, facsimile machines, and scanners, or electronic electric apparatuses having image pickup devices.

(Piezoelectric Acoustic Component)

Figure 14:
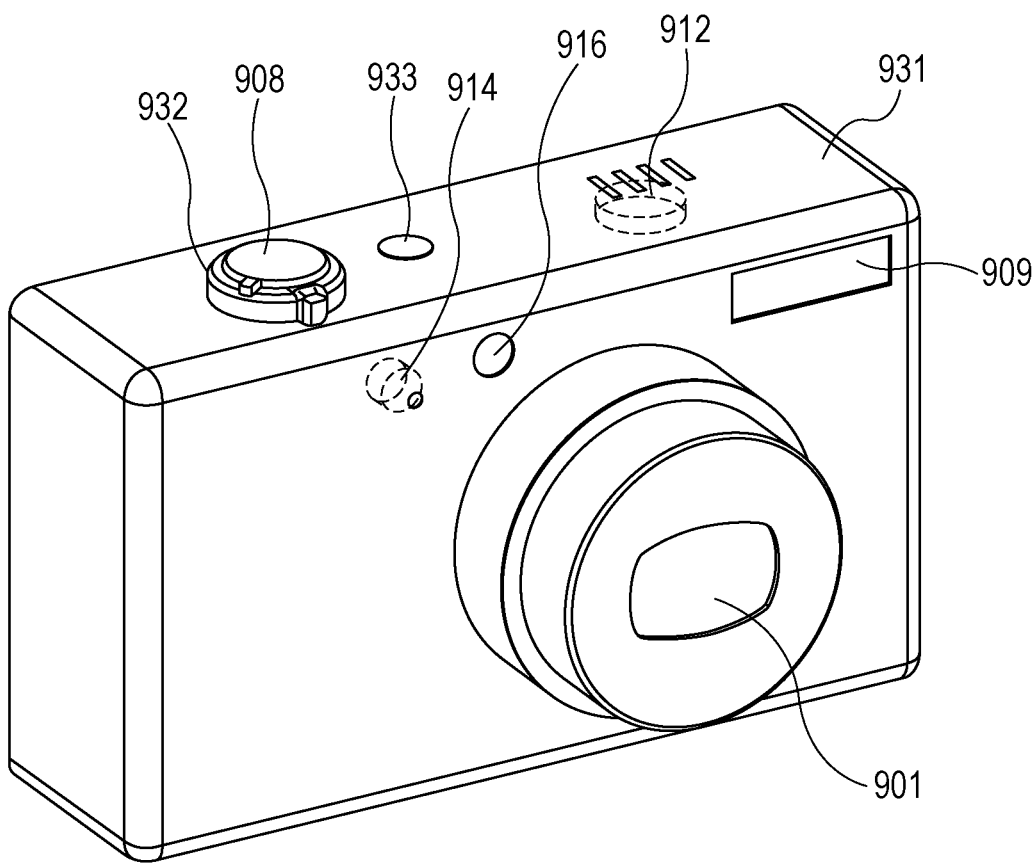
FIG. 14 is a schematic diagram illustrating an embodiment of an electronic apparatus of the present invention.

The piezoelectric acoustic component of the present invention will now be described. The piezoelectric acoustic component of the present invention includes the piezoelectric element or the layered piezoelectric element. Examples of the piezoelectric acoustic component include loudspeakers, buzzers, microphones, and surface acoustic wave (SAW) elements. FIG. 14 is a perspective general view of a digital camera, an embodiment of the electronic apparatus including a piezoelectric acoustic component of the present invention, viewed from the front.

(Electronic Apparatus)

The electronic apparatus of the present invention will now be described. The electronic apparatus of the present invention includes the piezoelectric element or the layered piezoelectric element.

FIG. 14 is a perspective general view of a digital camera body 931, an embodiment of the electronic apparatus of the present invention, viewed from the front. On the front of the body 931, an optical device 901, a microphone 914, a stroboscope light emitting unit 909, and an assist light unit 916 are disposed. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component of the present invention is used in at least one of the microphone 914, the loudspeaker 912, and the surface acoustic wave element.

Figure 15:
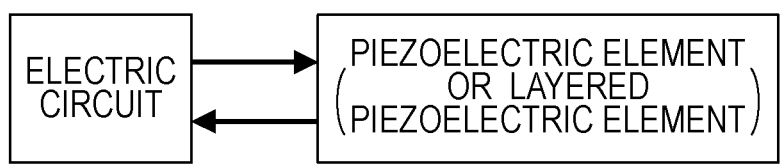
FIG. 15 is a schematic diagram illustrating an embodiment of an electronic apparatus including a piezoelectric element of the present invention.

Herein, a digital camera has been described as the electronic apparatus of the present invention. The electronic apparatus of the present invention can also be applied to electronic apparatuses having various piezoelectric acoustic components such as sound reproducers, recorders, cellular phones, and information terminals. FIG. 15 is a schematic diagram illustrating a configuration of an electronic apparatus including a piezoelectric element or layered piezoelectric element of the present invention. The electronic apparatus example of the present invention shown in FIG. 15 includes a piezoelectric element or layered piezoelectric element of the present invention, and includes an electric circuit that inputs power to or extracts power from the piezoelectric element or layered piezoelectric element. The input of power to the piezoelectric element or layered piezoelectric element allows expression of the function due to the inverse piezoelectric effect. In contrast, the extraction of power from the piezoelectric element or layered piezoelectric element allows detection of electric signals or extraction of energy caused by the direct piezoelectric effect.

As described above, the piezoelectric element or the layered piezoelectric element of the present invention can be suitably applied to liquid discharge heads, liquid discharge devices, ultrasonic motors, optical apparatuses, vibratory devices, dust removing devices, image pickup devices, piezoelectric acoustic component, and electronic apparatuses. The use of the piezoelectric element or the layered piezoelectric element of the present invention can provide a liquid discharge head having a nozzle density and a discharge rate that are equivalent to or higher than those in the case of using a piezoelectric element containing lead.

The use of the liquid discharge head of the present invention can provide a liquid discharge device having a discharge rate and a discharge precision that are equivalent to or higher than those in the case of using a piezoelectric element containing lead. The use of the piezoelectric element or the layered piezoelectric element of the present invention can provide an ultrasonic motor having driving power and durability that are equivalent to or higher than those in the case of using a piezoelectric element containing lead.

The use of the ultrasonic motor of the present invention can provide an optical apparatus having durability and an operation precision that are equivalent to or higher than those in the case of using a piezoelectric element containing lead.

The use of the piezoelectric element or the layered piezoelectric element of the present invention can provide a vibratory device having vibration ability and durability that are equivalent to or higher than those in the case of using a piezoelectric element containing lead.

The use of the vibratory device of the present invention can provide a dust removing device having dust removing efficiency and durability that are equivalent to or higher than those in the case of using a piezoelectric element containing lead.

The use of the dust removing device of the present invention can provide an image pickup device having a dust removing function that is equivalent to or higher than that in the case of using a piezoelectric element containing lead.

The use of a piezoelectric acoustic component of the present invention including the piezoelectric element or the layered piezoelectric element of the present invention can provide an electronic apparatus having sound-producing ability that is equivalent to or higher than that in the case of using a piezoelectric element containing lead.

The piezoelectric material of the present invention can be used not only in liquid discharge heads and motors but also in devices such as ultrasonic vibrators, piezoelectric actuators, piezoelectric sensors, and ferroelectric memories.

EXAMPLES

The piezoelectric material and the piezoelectric element of the present invention will now be more specifically described by examples, but the present invention is not limited to the following examples.

Example 1

Raw materials corresponding to a composition represented by Formula: $(Na_xBa_{1-y})(Nb_yTi_{1-y})O_3$, wherein x is 0.84, y is 0.88, and x/y is 0.95, i.e., $(Na_{0.84}Ba_{0.12})(Nb_{0.88}Ti_{0.12})O_3$, were weighed as follows.

Raw materials, sodium carbonate ($Na_2CO_3$, purity: 99.9% or more), niobium oxide ($Nb_2O_5$, purity: 99%, average grain diameter: 1000 nm), and barium titanate ($BaTiO_3$, purity: 99.9% or more, average grain diameter: 100 nm), were weighed at a ratio of Na, Ba, Nb, and Ti to give a composition $(Na_{0.84}Ba_{0.12})(Nb_{0.88}Ti_{0.12})O_3$. Zinc oxide (Zn(II)O, purity: 99.99%, average grain diameter: 1000 nm) was weighed such that the content of Zn was 0.010 mol based on 1 mol of the composition $(Na_{0.84}Ba_{0.12})(Nb_{0.88}Ti_{0.12})O_3$. Similarly, manganese oxide ($Mn(IV)O_2$, purity: 99.9%) was weighed such that the content of Mn was 0.005 mol, and magnesium oxide (MgO, purity: 99.99% or more) was weighed such that the content of Mg was 0.001 mol. These weighed powders and ethanol were wet-mixed using a ball mill for 24 hours. The mixture slurry was taken out from the ball mill and was heated at 80° C. to remove ethanol to prepare a mixed raw material powder. The mixed raw material powder was then heated at 900° C. in the atmosphere for 3 hours to give a calcined powder. The calcined powder was pulverized, and a polyvinyl butyral (PVB) binder was added to the calcined powder in an amount of 3 wt % relative to the weight of the calcined powder for granulation. A mold was filled with the granulated powder, and the granulated powder was compressed at a pressure of 200 MPa into a green compact having a diameter of 17 mm and a thickness of about 1 mm. The resulting green compact was heated at 1100° C. in the atmosphere for 6 hours as a firing process to give a piezoelectric material of the present invention as a ceramic sample.

The composition of the piezoelectric material was evaluated by inductively coupled plasma atomic emission spectrometry (ICP). The results demonstrated that the piezoelectric material of this Example was mainly composed of a metal oxide represented by $(Na_{0.84}Ba_{0.12})(Nb_{0.88}Ti_{0.12})O_3$ and contained 0.010 mol of Zn, 0.005 mol of Mn, and 0.001 mol of Mg based on 1 mol of the main component. The contents of Pb, K, and Co were each less than 1000 ppm based on 1 mol of the piezoelectric material. In this Example, the composition after sintering was substantially the same as the weighed composition by performing the firing at 1100° C. Even if the amounts of Na and Zn were decreased by heat treatment, a ceramic sample having a target composition could be obtained by increasing the weighed amounts according to the decrement in the process. This calcination process may be omitted.

The average equivalent circle diameter and the relative density of the crystal grains constituting the piezoelectric material were evaluated and were 3 μm and 98%, respectively. The crystal grains were mainly observed with a polarizing microscope, but the grain diameter of small crystal grains was specified with a scanning electron microscope (SEM). The average equivalent circle diameter was calculated by image processing of these observation images. The relative density was evaluated by an Archimedes's method.

Subsequently, the piezoelectric material was polished into a thickness of about 0.5 mm. X-ray diffraction of the polished surface of the sample at room temperature (27° C.) demonstrated that the primary phase of the ceramic sample was of a perovskite-type structure, and no diffraction of another phase was detected.

Subsequently, a piezoelectric element of the present invention was produced. In order to remove the stress inside the polished piezoelectric material and the organic components on the surface of the material, the piezoelectric material was heated at 400° C. in the atmosphere for 30 minutes. A metal electrode having a thickness of 400 nm was formed on each surface of the heat-treated piezoelectric material by DC sputtering. A titanium adhesive layer having a thickness of 30 nm was formed between each electrode and the ceramic. The resulting ceramic provided with electrodes was cut into a 10×2.5×0.5 mm strip-like piezoelectric element of the present invention.

Examples 2 to 9

Piezoelectric materials and piezoelectric elements of Examples 2 to 9 were produced as in Example 1 except that the target compositions were those shown in Table 1. The compositions of the piezoelectric materials were evaluated as in Example 1 and were confirmed to be the same as the compositions shown in Table 1. In Table 1, x represents the molar ration of Na, y represents the molar ratio of Nb, z represents the molar ratio of Zn, n represents the molar ratio of Mn, and a represents the molar ratio of Mg. The contents of Pb, K, and Co are not shown in the table, but were each less than 1000 ppm based on 1 mol of the piezoelectric material in each Example.

The average equivalent circle diameters and relative densities of the piezoelectric materials of Examples 2 to 9 were also evaluated as in Example 1. Every average equivalent circle diameter was in a range of 0.5 μm or more and 20 μm or less, the minimum average equivalent circle diameter was that of the piezoelectric material of Example 4, and the maximum average equivalent circle diameter was that of the piezoelectric material of Example 9. Every relative density was in a range of 93% to 99%, the minimum relative density was that of the piezoelectric material of Example 9, and the maximum relative density was that of the piezoelectric material of Example 3.

The piezoelectric materials of Examples 2 to 9 were polished as in Example 1, and the polished surfaces were subjected to X-ray diffraction measurement at room temperature. The primary phase of every piezoelectric material was of perovskite-type structure, and no diffraction of another phase was detected.

(Influence of Firing Temperature)

Substantially the same piezoelectric materials were obtained when the firing temperature of the piezoelectric materials of Examples 1 to 9 was changed to 1050° C. or 1150° C. That is, the firing temperature may be 1150° C. or less.

However, a firing temperature of 1000° C. provided a piezoelectric material having a relative density of less than 93% in some compositions. A firing temperature of 1200° C. provided a piezoelectric material having an average equivalent circle diameter of larger than 30 μm in some compositions.

Comparative Examples 1 to 6

Ceramics and elements of Comparative Examples 1 to 6 were produced as in Example 1. The target compositions are shown in Table 1. In Comparative Example 3, since the average equivalent circle diameter of the ceramic was less than 0.5 μm at a firing temperature of 1100° C., the ceramic was produced at a firing temperature of 1200° C. Evaluation of the ceramics as in Example 1 demonstrated that the ceramics had the compositions shown in Table 1.

The average equivalent circle diameters and the relative densities of the ceramics of Comparative Examples 1 to 6 were evaluated as in Example 1. Every ceramic had an average equivalent circle diameter in a range of 0.5 to 20 μm and a relative density in a range of 93% to 99%.

The ceramics of Comparative Examples 1 to 6 were polished as in Example 1, and the polished surfaces were subjected to X-ray diffraction measurement at room temperature. In the ceramics of Comparative Examples 1 to 3, 5, and 6, the primary phase was of perovskite-type structure, and no diffraction of another phase was detected. In the ceramic of Comparative Example 4, however, with respect to the diffraction peak of a perovskite-type structure, a diffraction peak not identifying any structure having an intensity of about one-fifth was also observed.

TABLE 1

| Sample | $(Na_xBa_{1-x})(Nb_yTi_{1-y})O_3$ (1 mol) | | | Zn (mol) | Mn (mol) | Mg (mol) |
| --- | --- | --- | --- | --- | --- | --- |
| | x | y | x/y | z | n | α |
| Example 1 | 0.84 | 0.88 | 0.95 | 0.010 | 0.005 | 0.001 |
| Example 2 | 0.85 | 0.88 | 0.97 | 0.010 | 0.005 | 0.005 |
| Example 3 | 0.87 | 0.88 | 0.99 | 0.010 | 0.005 | 0.010 |
| Example 4 | 0.87 | 0.88 | 0.99 | 0.010 | 0.005 | 0.020 |
| Example 5 | 0.83 | 0.85 | 0.98 | 0.005 | 0.002 | 0.010 |
| Example 6 | 0.83 | 0.85 | 0.98 | 0.010 | 0.002 | 0.010 |
| Example 7 | 0.85 | 0.85 | 1.00 | 0.020 | 0.002 | 0.010 |
| Example 8 | 0.83 | 0.85 | 0.98 | 0.050 | 0.002 | 0.010 |
| Example 9 | 0.92 | 0.95 | 0.97 | 0.010 | 0 | 0.010 |
| Comparative Example 1 | 0.82 | 0.88 | 0.93 | 0.010 | 0 | 0 |
| Comparative Example 2 | 0.87 | 0.88 | 0.99 | 0.010 | 0.005 | 0.050 |
| Comparative Example 3 | 0.88 | 0.88 | 1.00 | 0 | 0 | 0.020 |
| Comparative Example 4 | 0.93 | 0.95 | 0.98 | 0.060 | 0.005 | 0.010 |
| Comparative Example 5 | 0.82 | 0.80 | 1.03 | 0.010 | 0 | 0.005 |
| Comparative Example 6 | 0.97 | 0.97 | 1.00 | 0.010 | 0 | 0.005 |

(Evaluation of characteristics (electric resistivity, Curie temperature, ferroelectricity, and piezoelectricity) of piezoelectric element)

The piezoelectric elements prepared in Examples 1 to 9 and the elements prepared in Comparative Examples 1 to 6 were evaluated for electric resistivity with a semi-conductor parameter analyzer. The resistivity was determined by applying a DC voltage of 10 V between two electrodes of the elements disposed so as to face each other at room temperature (27° C.) and measuring the leak current after 20 seconds from the application. A resistivity of $1.0 \times 10^9$ ohm-cm or more, in particular, $3.0 \times 10^{10}$ ohm-cm or more, means that the piezoelectric element has sufficient insulation properties for practical use. The piezoelectric elements of Examples 1 to 9 had a resistivity in a range of $40 \times 10^9$ to $2000 \times 10^9$ ohm-cm. The elements of Comparative Examples 1 to 3, 5, and 6 had resistivity in a range of $2.0 \times 10^9$ to $60 \times 10^9$ ohm-cm. The elements of Comparative Example 4 had a large leak current and had a resistivity of less than $1 \times 10^3$ ohm-cm.

The changes in relative dielectric constant were measured with changing the temperature of the piezoelectric elements prepared in Examples 1 to 9 and the elements prepared in Comparative Examples 1 to 6, and the Curie temperature of each element was determined as the temperature showing the maximum relative dielectric constant attributed to the phase transition from a tetragonal structure to a cubic structure. The piezoelectric elements of Examples 1 to 9 and the elements of Comparative Examples 1 to 3 and 6 all had high Curie temperatures of 160° C. or more suitable for practical use of the elements, whereas the element of Comparative Example 4 had large leak currents not to specify the Curie temperatures. The element of Comparative Example 5 had a low Curie temperature of 60° C.

Prior to evaluation of the ferroelectric properties and the piezoelectric properties, the piezoelectric elements prepared in Examples 1 to 9 and the elements prepared in Comparative Examples 1 to 6 were polarized. Specifically, a voltage of 5 kV/mm was applied to a sample in an oil bath maintained at 150° C. for 30 minutes, and the sample was then cooled to room temperature while applying the voltage. The elements of Comparative Examples 4 and 5 had large leakage currents at 150° C. and were thereby prevented from polarizing, and therefore the subsequent evaluations of ferroelectricity and piezoelectric properties were not performed.

In order to judge whether the piezoelectric elements prepared in Examples 1 to 9 and the elements prepared in Comparative Examples 1 to 3 and 6 had ferroelectricity in a practical electric field or not, the polarization-electric field hysteresis was measured at room temperature (27° C.). A material showing ferroelectricity in a certain temperature region can also be used in a memory element. Regarding the elements judged to have ferroelectricity, the coercive electric field and the internal electric field were calculated, and the sizes of the fields were compared. Specifically, the polarization quantity when an AC electric field (triangular waves) was applied to the piezoelectric element of the present invention was measured. The AC electric field had a frequency of 10 to 100 Hz, and the maximum intensity of the electric field was ±45 kV/cm. The coercive electric field can be calculated from the electric field intensity (+Ec) at which the spontaneous polarization is reversed from negative to positive and the electric field intensity (−Ec) at which the spontaneous polarization is reversed from positive to negative in a polarization-electric field curve. The internal electric field was calculated as the average of +Ec and −Ec (the amount of shift from the origin in the direction of the electric field axis and is minus when the absolute value of −Ec is large). The piezoelectric elements of Examples 1 to 9 and the elements of Comparative Examples 1 to 3 and 6 had ferroelectricity showing reversion of the spontaneous polarization according to the external electric field. The intensity of the coercive electric field ((the absolute value of +Ec)+(the absolute value of −Ec)/2) had a tendency of increasing with the content of Mg. The internal electric field had a tendency of increasing in the minus direction with the content of Mg. In particular, the piezoelectric elements of Examples 3 to 9 had a coercive electric field of 16.0 kV or more and an internal electric field of −2.0 kV/cm or less.

The piezoelectric constants ($d_{31}$) and the mechanical quality factors ($Q_m$) of the piezoelectric elements prepared in Examples 1 to 9 and the elements prepared in Comparative Examples 1 to 3 and 6 were measured by a resonance-antiresonance method. The results of the measurement are shown in Table 2.

TABLE 2

| Sample | Piezoelectric constant $|d_{31}|$ (pm/V) | Mechanical quality factor $Q_m$ |
| --- | --- | --- |
| Example 1 | 55 | 450 |
| Example 2 | 56 | 470 |
| Example 3 | 56 | 480 |
| Example 4 | 50 | 500 |
| Example 5 | 50 | 470 |
| Example 6 | 53 | 480 |
| Example 7 | 51 | 460 |
| Example 8 | 48 | 460 |
| Example 9 | 44 | 470 |
| Comparative Example 1 | 22 | 240 |
| Comparative Example 2 | 29 | 440 |
| Comparative Example 3 | 10 | 380 |
| Comparative Example 6 | 19 | 430 |

The piezoelectric constant ($d_{33}$) of each sample was measured with a $d_{33}$ meter using the Berlincourt method principle.

(Comparison of Piezoelectric Constant and Mechanical Quality Factor)

Every piezoelectric element of Examples 1 to 9 had satisfactory piezoelectric constant ($d_{31}$) and mechanical quality factor (Qm) and had a piezoelectric constant ($d_{33}$) of 140 pC/N or more measured with a $d_{33}$ meter using the Berlincourt method principle.

The piezoelectric elements of Examples 1 to 8 containing Mn each had a piezoelectric constant ($d_{31}$) of 48 pm/V or more.

The piezoelectric elements of Examples 2 to 9, containing Mg in an amount of 0.005 mol or more and 0.020 mol or less based on 1 mol of the metal oxide as the main component, each had a mechanical quality factor of 460 or more.

The element of Comparative Example 1 did not contain Mg and thereby had a low mechanical quality factor, and contained Na in only a small amount and thereby had a small piezoelectric constant ($d_{31}$).

The element of Comparative Example 2 contained an excessive amount of Mg and had a low piezoelectric constant ($d_{31}$).

The element of Comparative Example 3 did not contain both Zn and Mn and thereby had a low piezoelectric constant ($d_{31}$).

The element of Comparative Example 4 contained an excessive amount of Zn and had a large leakage current, which prevented evaluation of piezoelectric properties.

The element of Comparative Example 5 had a too small y value (Nb component ratio) and had a low Curie temperature, which prevented evaluation of piezoelectric properties.

The element of Comparative Example 6 had a too large y value (Nb component ratio) and had a small piezoelectric constant ($d_{31}$).

Example 10

Raw materials corresponding to those in Example 3 were weighed as follows.

A raw material powder was prepared as in Example 3 and was wet-mixed using a ball mill for 24 hours for dehydration. A PVB binder was added to this mixed raw material powder, followed by mixing. The mixture was formed into a green sheet having a thickness of 50 µm by a doctor blade method.

A conductive paste for an internal electrode layer was printed on the green sheet. As the conductive paste, an Ag70%–Pd30% (Ag/Pd=2.33) alloy paste was used. Nine green sheets each provided with the conductive paste were stacked to give a layered product. The layered product was fired at 1050° C. for 5 hours to obtain a sintered compact. The sintered compact was cut into a size of 10×2.5 mm. The side faces were then polished, and a pair of external electrodes (a first electrode and a second electrode) for alternately short-circuiting the internal electrode layers was formed by sputtering Au to produce a layered piezoelectric element as shown in FIG. 2B.

Observation of the internal electrode layers of the layered piezoelectric element revealed that Ag—Pd as the electrode material and the piezoelectric material were alternately formed.

Prior to evaluation of piezoelectricity, the layered piezoelectric element sample was polarized. Specifically, the sample was heated to 150° C. in an oil bath, a voltage of 2 kV/mm was applied between the first and the second electrodes for 30 minutes, and the sample was cooled to room temperature while applying the voltage.

Evaluation of the piezoelectricity of the resulting layered piezoelectric element demonstrated that the element had sufficient insulation properties and satisfactory piezoelectric properties equivalent to those of the piezoelectric material of Example 3.

Example 11

A liquid discharge head shown in FIGS. 3A and 3B was produced using the piezoelectric element of Example 3. Discharge of an ink according to input electric signals was confirmed.

Example 12

A liquid discharge device shown in FIG. 4 was produced using the liquid discharge head of Example 11. Discharge of an ink according to input electric signals was confirmed.

Example 13

An ultrasonic motor shown in FIG. 6A was produced using the piezoelectric element of Example 3. Rotation of the motor according to application of an AC voltage was confirmed.

Example 14

An optical apparatus shown in FIGS. 7A and 7B was produced using the ultrasonic motor in Example 13. Autofocus operation according to application of an AC voltage was confirmed.

Example 15

A dust removing device shown in FIGS. 9A and 9B was produced using the piezoelectric element of Example 3. A satisfactory dust removing efficiency for dispersed plastic beads was confirmed by applying an AC voltage.

Example 16

An image pickup device shown in FIG. 12 was produced using the dust removing device of Example 15. In the operation of the device, dust on the surface of the image pickup unit was satisfactorily removed to provide a dust defect-free image.

Example 17

A liquid discharge head shown in FIGS. 3A and 3B was produced using the layered piezoelectric element of Example 10. Discharge of an ink according to input electric signals was confirmed.

Example 18

A liquid discharge device shown in FIG. 4 was produced using the liquid discharge head of Example 17. Discharge of an ink according to input electric signals was confirmed.

Example 19

An ultrasonic motor shown in FIG. 6B was produced using the layered piezoelectric element of Example 10. Rotation of the motor according to application of an AC voltage was confirmed.

Example 20

An optical apparatus shown in FIGS. 7A and 7B was produced using the ultrasonic motor of Example 19. Autofocus operation according to application of an AC voltage was confirmed.

Example 21

A dust removing device shown in FIGS. 9A and 9B was produced using the layered piezoelectric element of Example 10. A satisfactory dust removing efficiency for dispersed plastic beads was confirmed by applying an AC voltage.

Example 22

An image pickup device shown in FIG. 12 was produced using the dust removing device of Example 21. In the operation of the device, dust on the surface of the image pickup unit was satisfactorily removed to provide a dust defect-free image.

Example 23

A piezoelectric acoustic component and an electronic apparatus shown in FIG. 14 were produced using the layered piezoelectric element of Example 10. Loudspeaker operation according to application of an AC voltage was confirmed.

Example 24

A piezoelectric acoustic component and an electronic apparatus shown in FIG. 14 were produced using the piezoelectric element of Example 3. Loudspeaker operation according to application of an AC voltage was confirmed.

The piezoelectric material of the present invention expresses satisfactory piezoelectricity even at high environmental temperature. In addition, since the piezoelectric material does not contain lead, its load on the environment is low. Accordingly, the piezoelectric material of the present invention can be used in various apparatuses including a large amount of the piezoelectric material, such as liquid discharge heads, ultrasonic motors, and dust removing devices, without causing any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A piezoelectric material comprising:
a perovskite-type metal oxide represented by Formula (1): $(Na_xBa_{1-y})(Nb_yTi_{1-y})O_3$, where x is 0.83 or more and 0.95 or less, y is 0.85 or more and 0.95 or less, and x/y is 0.95 or more and 1.05 or less;
Zn; and
Mg,
wherein
the content of Zn is 0.005 mol or more and 0.050 mol or less based on 1 mol of the perovskite-type metal oxide; and
the content of Mg is 0.001 mol or more and 0.020 mol or less based on 1 mol of the perovskite-type metal oxide.

2. The piezoelectric material according to claim 1, wherein the piezoelectric material is constituted by crystal grains having an average equivalent circle diameter of 0.5 µm or more and 20 µm or less.

3. A method of producing the piezoelectric material according to claim 1, the method comprising:
a step of firing a raw material powder at least containing Na, Nb, Ba, Ti, Zn, and Mg, wherein
the molar ratio of Na to Nb contained the raw material powder is 0.95 or more and 1.10 or less.

4. The method according to claim 3, wherein the firing temperature is 1000° C. or more and 1150° C. or less.

5. A piezoelectric element comprising:
an electrode;
a piezoelectric material member;
wherein
the piezoelectric material member is the piezoelectric material according to claim 1.

6. The piezoelectric element according to claim 5 comprising:
a plurality of the piezoelectric material; and
a plurality of the electrodes,
wherein
the piezoelectric material and the electrodes are alternately stacked.

7. The piezoelectric element according to claim 6, wherein
the electrode contains Ag and Pd at a weight ratio M1/M2 of the weight M1 of Ag to the weight M2 of Pd is 1.5 or more and 9.0 or less.

8. The piezoelectric element according to claim 6, wherein
the electrode contains at least one of Ni and Cu.

9. A liquid discharge head comprising:
a liquid chamber including a vibratory unit including the piezoelectric element according to claim 5; and
a discharge port communicating with the liquid chamber.

10. A liquid discharge device comprising:
a transfer object-holding unit; and
the liquid discharge head according to claim 9.

11. An ultrasonic motor comprising:
a vibratory component including the piezoelectric element according to claim 5; and
a movable component being in contact with the vibratory component.

12. An optical apparatus comprising:
a driving unit including the ultrasonic motor according to claim 11.

13. A vibratory device comprising:
a vibratory component including a diaphragm provided with the piezoelectric element according to claim 5.

14. A dust removing device comprising:
a vibratory unit including the vibratory device according to claim 13.

15. An image pickup device comprising:
the dust removing device according to claim 14; and
an image pickup element unit, wherein
the dust removing device has a diaphragm on the light-receiving surface side of the image pickup element unit.

16. A piezoelectric acoustic component comprising:
the piezoelectric element according to claim 5.

17. An electronic apparatus comprising:
the piezoelectric element according to claim 5; and
an electric circuit.

* * * * *